US009805827B2

(12) United States Patent
Son et al.

(10) Patent No.: US 9,805,827 B2
(45) Date of Patent: Oct. 31, 2017

(54) SEMICONDUCTOR MEMORY DEVICES, MEMORY SYSTEMS INCLUDING THE SAME AND METHODS OF OPERATING THE SAME

(71) Applicant: Samsung Electronics Co., Ltd., Suwon-si (KR)

(72) Inventors: Jong-Pil Son, Seongnam-si (KR); Chul-Woo Park, Yongin-si (KR); Hoi-Ju Chung, Yongin-si (KR); Sang-Uhn Cha, Yongin-si (KR); Seong-Jin Jang, Seongnam-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 14/817,212

(22) Filed: Aug. 4, 2015

(65) Prior Publication Data

US 2016/0155515 A1   Jun. 2, 2016

(30) Foreign Application Priority Data

Nov. 28, 2014  (KR) .......................... 10-2014-0168404

(51) Int. Cl.
| | | |
|---|---|---|
| *G11C 11/16* | (2006.01) | |
| *G11C 11/4096* | (2006.01) | |
| *G11C 29/42* | (2006.01) | |
| *G11C 29/44* | (2006.01) | |

(52) U.S. Cl.
CPC ...... *G11C 29/4401* (2013.01); *G11C 11/4096* (2013.01); *G11C 29/42* (2013.01); *G11C 11/16* (2013.01); *G11C 2029/4402* (2013.01)

(58) Field of Classification Search
CPC . G11C 29/4401; G11C 29/42; G11C 11/4096; G11C 2029/4402; G11C 11/16; G11C 29/44; G11C 2029/0411; G06F 11/1048
USPC ................................................. 714/763, 710
See application file for complete search history.

(56) References Cited

U.S. PATENT DOCUMENTS

| | | | | |
|---|---|---|---|---|
| 7,155,643 | B2 * | 12/2006 | Ichikawa ............... | G11C 29/44 365/201 |
| 7,249,296 | B2 * | 7/2007 | Hirabayashi ........... | G11C 29/42 365/201 |
| 7,266,747 | B2 * | 9/2007 | Foss .................... | G06F 11/1044 714/755 |
| 7,305,607 | B2 | 12/2007 | Kang et al. | |
| 7,518,936 | B2 * | 4/2009 | Kobatake ............... | G11C 29/44 365/200 |

(Continued)

FOREIGN PATENT DOCUMENTS

| | | |
|---|---|---|
| JP | 2013-114712 A | 6/2013 |
| KR | 2008-0007806 A | 1/2008 |
| KR | 0809070 B | 3/2008 |

*Primary Examiner* — James C Kerveros
(74) *Attorney, Agent, or Firm* — Muir Patent Law, PLLC

(57) ABSTRACT

A semiconductor memory device includes a memory cell array and a test circuit. The test circuit reads data stream from the memory cell array, configured to, on comparing bits of each first unit in the data stream, compares corresponding bits in the first units as each second unit and outputs a fail information signal including pass/fail information on the data stream and additional information on the data stream, in a test mode of the semiconductor memory device.

20 Claims, 27 Drawing Sheets

(56) References Cited

U.S. PATENT DOCUMENTS

| | | | |
|---|---|---|---|
| 7,594,157 B2* | 9/2009 | Choi | G11C 11/5628 |
| | | | 365/185.09 |
| 7,624,317 B2 | 11/2009 | Byun et al. | |
| 7,689,881 B2* | 3/2010 | Shuma | G06F 11/1008 |
| | | | 714/710 |
| 7,779,334 B2* | 8/2010 | Earle | G06F 11/1048 |
| | | | 365/185.09 |
| 7,890,820 B2 | 2/2011 | Peng | |
| 7,984,345 B2* | 7/2011 | Ozawa | G01R 31/31932 |
| | | | 365/201 |
| 8,069,377 B2* | 11/2011 | Singh | G01J 3/02 |
| | | | 714/711 |
| 8,359,521 B2* | 1/2013 | Kim | G06F 11/1004 |
| | | | 714/758 |
| 8,370,708 B2 | 2/2013 | Lee | |
| 8,689,077 B2* | 4/2014 | Klein | G11C 7/20 |
| | | | 714/754 |
| 9,208,024 B2* | 12/2015 | Pelley | G06F 11/1076 |
| 2003/0204798 A1* | 10/2003 | Adams | G06F 11/1008 |
| | | | 714/723 |
| 2005/0114064 A1 | 5/2005 | Shin et al. | |
| 2005/0160332 A1* | 7/2005 | Hirabayashi | G11C 29/42 |
| | | | 714/718 |
| 2006/0184856 A1* | 8/2006 | Suzuki | G11C 7/24 |
| | | | 714/758 |
| 2008/0082870 A1 | 4/2008 | Park | |
| 2008/0091979 A1* | 4/2008 | Okuda | G11C 29/42 |
| | | | 714/42 |
| 2011/0041016 A1* | 2/2011 | O'Connell | G06F 11/1048 |
| | | | 714/711 |
| 2012/0124436 A1 | 5/2012 | Okahiro et al. | |

\* cited by examiner

480b(UE)

480c(CE)

480c(UE)

SEMICONDUCTOR MEMORY DEVICES, MEMORY SYSTEMS INCLUDING THE SAME AND METHODS OF OPERATING THE SAME

CROSS-REFERENCE TO RELATED APPLICATIONS

This US application claims the benefit of priority under 35 USC §119 to Korean Patent Application No. 10-2014-0168404, filed on Nov. 28, 2014, in the Korean Intellectual Property Office, the contents of which are incorporated herein in their entirety by reference.

BACKGROUND

The present disclosure relates to memory devices, and more particularly to semiconductor memory devices, memory systems including the same and methods of operating the same.

Semiconductor memory devices may be classified into non-volatile memory devices such as flash memory devices and volatile memory devices such as DRAMs. High speed operation and cost efficiency of DRAMs make it possible for DRAMs to be used for system memories. Due to the continuing shrink in fabrication design rule of DRAMs, bit errors of memory cells in the DRAMs may rapidly increase.

SUMMARY

Some example embodiments may provide a semiconductor memory device capable of enhancing performance.

Some example embodiments may provide a memory system including the semiconductor memory device capable of enhancing performance.

Some example embodiments may provide a method of operating a semiconductor memory device, capable of enhancing performance.

According to example embodiments, a semiconductor memory device includes a memory cell array and a test circuit. During a test mode of the semiconductor memory device, the test circuit reads out data stream from the memory cell array, perform a first comparing of bits of each first unit in the data stream, store the first comparing result as a first result signal, perform a second comparing of corresponding bits in the first unit as each second unit, store the second comparing result as a second result signal and outputs a fail information signal including pass/fail information on the data stream and additional information on the data stream based on the first result signal and the second result signal.

In example embodiments, the data stream may be test pattern data written in the memory cell array. The fail information signal may include the first result signal representing a comparison result of the bits of each first unit in the test pattern data and the second result signal representing a comparison result of the corresponding bits in the first units as each second unit. The additional information may indicate whether a number of fail cells in a memory region of the memory cell array, corresponding to the data stream, is a single-bit error or a multi-bit error and positions of the fail cells. The first unit may correspond to data of a burst length of the semiconductor memory device.

The test circuit may include a first comparison circuit and a second comparison circuit. The first comparison circuit may compare the bits of each first unit in the test pattern data to output the first result signal. The second comparison circuit may compare each second unit to output the second result signal.

The first comparison circuit may output the first comparison signal indicating whether the bits of each first unit in the test pattern are same with respect to each other and the second comparison circuit may output the second comparison signal indicating whether the bits of each second unit in the test pattern are same with respect to each other.

The test circuit may write the test pattern data in the memory cell array on codeword basis. The memory cell array may include a plurality of first memory blocks and a second memory block. The semiconductor memory device may further include a fail address memory, a fail manage circuit, an error correction code (ECC) circuit and a plurality of switching circuit. The fail address memory may store the first result signal and the second result signal. The fail manage circuit may choose to repair fail cells with a redundancy repairing operation or correct the fail cells with ECC operation based on a number of the fail cells, included in an access address, by referring to the fail address memory, in a normal mode of the semiconductor memory device. The ECC circuit may perform the ECC operation under control of the fail manage circuit. The plurality of switching circuit may be coupled to a plurality of first memory cells in the first memory blocks through first bit-lines and may be coupled to a plurality of second memory cells in the second memory block through second bit-lines.

The fail manage circuit may repair the fail cells by the redundancy repair operation when the number of the fail cells is equal to or greater than two. The fail manage circuit may control the switching circuits such that a first block of the first memory blocks is replaced by a second block of the second memory block when the fail manage circuit performs the redundancy repair operation.

The fail manage circuit may correct the fail cells by the ECC operation when the number of the fail cells is equal to one. The fail manage circuit may control the switching circuits for parity bits repairing the fail cell of the first memory cells to be stored in the second memory cells.

The fail address memory may include a first region and a second region that store the first result signal and the second result signal, respectively, on the codeword basis. The first result signal may include a plurality of first bits, and each of the first bits may correspond to each first unit. The second result signal may include a plurality of second bits, and each of the second bits may correspond to each second unit.

The fail manage circuit may repair the fail cells by one of the ECC operation and the redundancy repair operation based on a number of error bits of the first bits and the second bits, and each error bit may have a first logic level. The fail manage circuit may identify second error bits by erasing first error bits of the first result signals stored in the first region, and may perform the redundancy repair operation based on the second error bits stored in the first region. Each erased first error bit may be correctable by the ECC circuit.

The fail address memory may include a first region and a second region that store the first result signal and the second result signal, respectively on the codeword basis. The first result signal may include one of a plurality of first bits, each corresponding to each first unit and a plurality of third bits into which the first bits are coded. The second result signal may include one of a plurality of second bits, each corresponding to each second unit and a plurality of fourth bits into which the second bits are coded.

The test circuit may write the test pattern data, may read the test pattern data and may output the first result signal and the second result signal for each test item in the test mode. The fail address memory may store the first result signal and the second result signal by accumulating the first result signal and the second result for each test item.

In example embodiments, the test circuit may provide the fail information signal to an external test device. The test device may determine a repair policy of the fail cells based on a number of the fail cells in the fail information signal. The memory cell array may be a three dimensional memory cell array. The semiconductor memory device may further include a control logic circuit. The control logic circuit may compare an access address with fail addresses of the fail cells and may repair the fail cells by one of the ECC operation and the redundancy repair operation based on a number of fail cells in the access address.

According to example embodiments, a memory system includes a semiconductor memory device and a test device. The test device tests the semiconductor memory device. The semiconductor memory device includes a memory cell array and a test circuit. The test circuit reads data stream from the memory cell array, on comparing bits of each first unit in the data stream, compares corresponding bits in the first units as each second unit and outputs a fail information signal including pass/fail information on the data stream and additional information on the data stream, in a test mode of the semiconductor memory device.

In example embodiments, the data stream may be test pattern data written in the memory cell array. The fail information signal may include a first result signal representing a comparison result of the bits of each first unit in the test pattern data and a second result signal representing a comparison result of the corresponding bits in the first units as each second unit. The first unit may correspond to data of a burst length of the semiconductor memory device.

The test circuit may write the test pattern data in the memory cell array on codeword basis. The test device may provide the test pattern data to the semiconductor memory device. The test device may include a fail address memory that stores the first result signal and the second result signal on the codeword basis.

The test circuit may write the test pattern data, may read the test pattern data and may output the first result signal and the second result signal to the test device for each test item in the test mode. The fail address memory may store the first result signal and the second result signal and accumulate the first result signal and the second result for each test item.

According to example embodiments, in a method of operating a semiconductor memory device, test pattern data is read from a memory cell array in a codeword basis, in a test mode of the semiconductor memory device. On comparing bits of each first unit in the test pattern date to output a first result signal, corresponding bits in the first units as each second unit are compared to output a second result signal. The first result signal and the second result signal are stored in a first region and a second region of a fail address memory respectively. Fail cells are repaired by one of an error correction code (ECC) operation and a redundancy repair operation based on a number of the fail cells, included in an access address, by referring to the fail address memory, in a normal mode of the semiconductor memory device.

In example embodiments, the fail cells may be repaired by the ECC operation when the number of the fail cells is equal to one.

In example embodiments, the memory cell array may include a plurality of first memory blocks and a second memory block. The first unit may correspond to data of a burst length of each of the first memory blocks and the second memory block.

Accordingly, a test circuit of a semiconductor memory device, on comparing bits of each first unit in read data stream to output a first comparison signal, compares corresponding bits in the first units as each second unit to output a second comparison signal, and stores the first result signal and the second result signal in a fail address memory. A fail manage circuit or a test device may determine a repairing policy of fail cells by referring to the fail address memory.

BRIEF DESCRIPTION OF THE DRAWINGS

Example embodiments will be described below in more detail with reference to the accompanying drawings.

DETAILED DESCRIPTION

Figure 1:
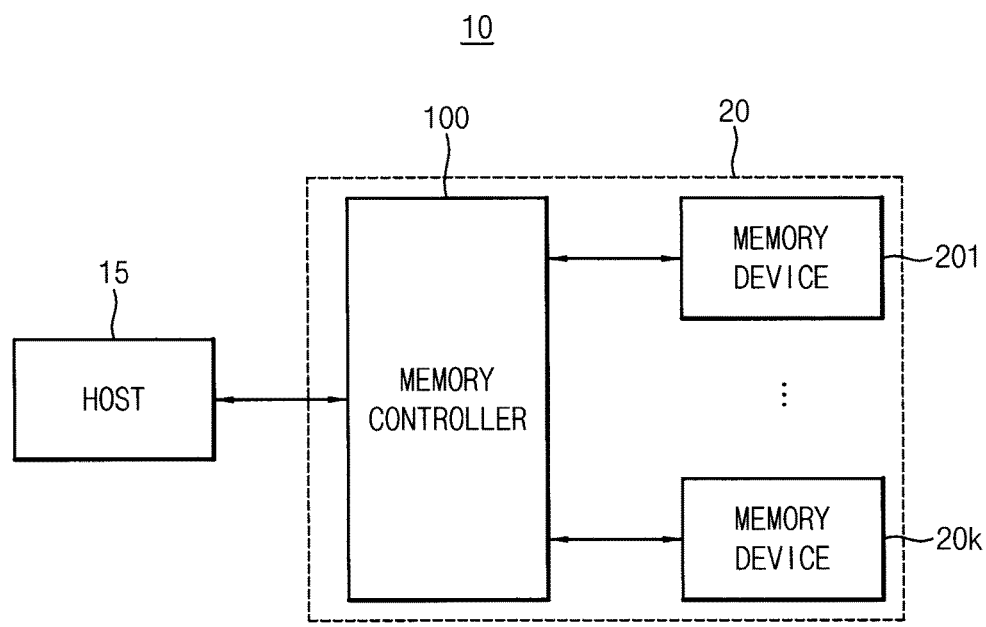
FIG. 1 is a block diagram illustrating an electronic system according to example embodiments.

Various example embodiments will be described more fully hereinafter with reference to the accompanying drawings, in which some example embodiments are shown. However, the present inventive concept may be embodied in many different forms and should not be construed as limited to the example embodiments set forth herein. These example embodiments are just for disclosing of the inventive concept and many implementations and variations are possible that do not require the details provided herein. It should also be emphasized that the present inventive concept provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the present inventive concept. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are generally used to distinguish one element from another. Thus, a first element discussed below in one section of the specification could be termed a second element in a different section of the specification without departing from the teachings of the present inventive concept. Also, terms such as "first" and "second" may be used in the claims to name an element of the claim, even thought that particular name is not used to describe in connection with the element in the specification. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Development of fine feature semiconductor manufacturing technology has increased the memory capacity of a semiconductor memory device. Due to the increased capacity, 'fail' memory cells including defective cells and weak cells also increased. The defective cells may not perform data storing function due to hardware defect. For example, the defective cells may be memory cells that do not operate due to a defect generated during manufacturing process, e.g., memory cells in which a disconnection or short of a wiring may have occurred. The weak cells are software-defective. That is, the weak cells are memory cells that are defective under a specific voltage condition or specific operation timing. Examples of weak cells may include cells that deteriorate in terms of their characteristics, e.g., shortened refresh duration, degraded cell write performance or variable retention time, etc.

To secure the manufacturing yield, 'fail' memory cells are repaired by replacing them with redundant memory cells. However, a sufficient yield may not be achieved only using a redundancy repair operation because of increased number of defective memory cells. Especially, increased number of single bit errors has become a major obstacle in enhancing the manufacturing yields. Thus, a method of repairing error bits by applying an error correction code (ECC) operation as well as a redundancy repair operation in dynamic random access memory (DRAM) has been introduced.

The ECC operation provides an ECC function to detect and correct errors that occurred during writing/reading of data. To provide data integrity, the DRAM may employ an ECC circuit. For example, the ECC circuit may perform the ECC operation using parity bits during detection/correction of errors.

FIG. 1 is a block diagram illustrating an electronic system according to example embodiments.

Referring to FIG. 1, an electronic system 10 may include a host 15 and a memory system 20. The memory system 20 may include a memory controller 100 and a plurality of semiconductor memory devices 201~20k (k is an integer greater than two).

The host 15 may communicate with the memory system 20 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 15 may also communicate with the memory system 20 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 20. The memory controller 100 may control an overall data exchange between the host 15 and the plurality of semiconductor memory devices 201~20k. For example, the memory controller 100 may write data in the plurality of semiconductor memory devices 201~20k or read data from the plurality of semiconductor memory devices 200a~200k in response to request from the host 20.

In addition, the memory controller 100 may issue operation commands to the plurality of semiconductor memory devices 201~20k for controlling the plurality of semiconductor memory devices 201~20k.

In some embodiments, each of the plurality of semiconductor memory devices 201~20k may be a may be a memory device including resistive type memory cells such as a magnetoresistive random access memory (MRAM), a resistive random access memory (RRAM), a phase change random access memory (PRAM) and a ferroelectric random access memory (FRAM), etc. In other example embodiments, each of the plurality of semiconductor memory devices 201~20k may be a memory device including dynamic memory cells such as a dynamic random access memory (DRAM).

An MRAM is a nonvolatile computer memory based on magnetoresistance. An MRAM is different from a volatile RAM in many aspects. For example, since an MRAM is nonvolatile, the MRAM may retain all stored data even when power is turned off.

Although a nonvolatile RAM is generally slower than a volatile RAM, an MRAM has read and write response times comparable with read and write response times of a volatile RAM. Unlike a conventional RAM that stores data as electric charge, an MRAM stores data by using magnetoresistance (or magnetoresistive) elements. In general, a magnetoresistance element is made of two magnetic layers, each having a magnetization.

An MRAM is a nonvolatile memory device that reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or remove data by using the variation of the resistance value.

An MRAM using a spin transfer torque (STT) phenomenon uses a method in which when a spin-polarized current flows in one direction, a magnetization direction of the magnetic layer is changed due to the spin transfer of electrons. A magnetization direction of one magnetic layer (e.g., a pinned layer) may be fixed and a magnetization direction of the other magnetic layer (e.g., a free layer) may vary according to a magnetic field generated by a program current.

The magnetic field of the program current may arrange the magnetization directions of the two magnetic layers in parallel or in anti-parallel. In at least one example embodiment, if the magnetization directions of the two magnetic layers are parallel, a resistance between the two magnetic layers is in a low ("0") state. If the magnetization directions of the two magnetic layers are anti-parallel, a resistance between the two magnetic layers is in a high ("1") state. Switching of the magnetization direction of the free layer and the high or low state of the resistance between the two magnetic layers result in write and read operations of the MRAM.

Although the MRAM is nonvolatile and provides a quick response time, an MRAM cell has a limited scale and is sensitive to write disturbance because the program current applied to switch the high and low states of the resistance between the magnetic layers of the MRAM is typically high. Accordingly, when a plurality of cells are arranged in an MRAM array, a program current applied to one memory cell changes a magnetic field of a free layer of an adjacent cell. Such a write disturbance may be mitigated (or alternatively, prevented) by using an STT phenomenon. A typical STT-MRAM may include a magnetic tunnel junction (MTJ), which is a magnetoresistive data storage device including two magnetic layers (e.g., a pinned layer and a free layer) and an insulating layer disposed between the two magnetic layers.

A program current typically flows through the MTJ. The pinned layer spin-polarizes electrons of the program current, and a torque is generated as the spin-polarized electron current passes through the MTJ. The spin-polarized electron current applies the torque to the free layer while interacting with the free layer. When the torque of the spin-polarized electron current passing through the MTJ is greater than a threshold switching current density, the torque applied by the spin-polarized electron current is sufficient to switch a magnetization direction of the free layer. Accordingly, the magnetization direction of the free layer may be parallel or anti-parallel to the pinned layer and a resistance state in the MTJ is changed.

The STT-MRAM removes a requirement of an external magnetic field for the spin-polarized electron current to switch the free layer in the magnetoresistive device. In addition, the STT-MRAM improves scaling as a cell size is reduced and the program current is reduced to mitigate (or alternatively, prevent) the write disturbance. In addition, the STT-MRAM may have a high tunnel magnetoresistance ratio, which improves a read operation in a magnetic domain by allowing a high ratio between the high and low states.

An MRAM is an all-round memory device that is low cost and has high capacity (like a dynamic random access memory (DRAM), operates at high speed (like a static random access memory (SRAM), and is nonvolatile (like a flash memory).

Figure 2A:
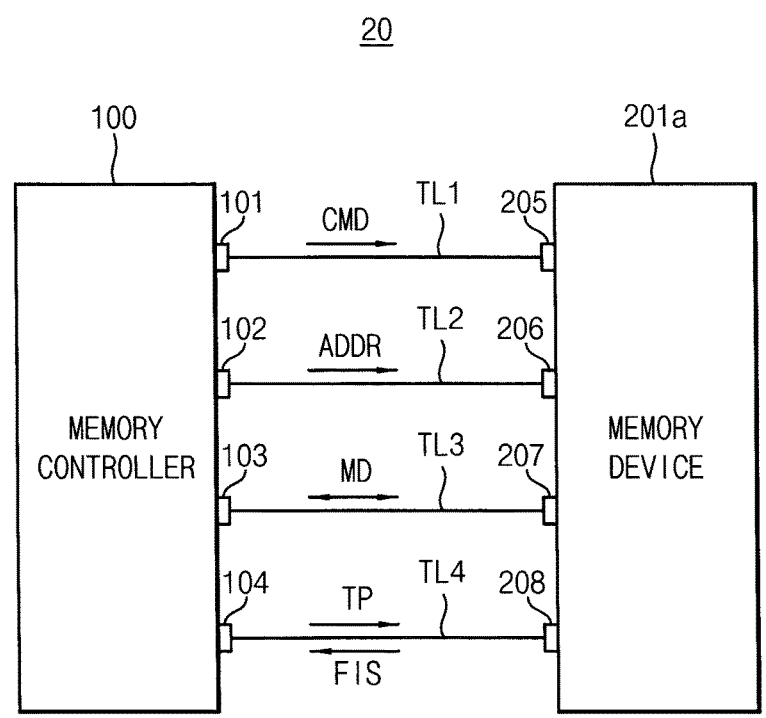
FIG. 2A is a block diagram illustrating the memory system shown in FIG. 1, according to example embodiments.

FIG. 2A is a block diagram illustrating the memory system shown in FIG. 1.

In FIG. 2A, only one semiconductor memory device 201a in communication with the memory controller 100 is illustrated for convenience. However, the details discussed herein related to semiconductor memory device 201a may equally apply to the other semiconductor memory devices 202~20k.

Referring to FIG. 2A, the memory system 20 may include the memory controller 100 and the semiconductor memory device 201a. Each of the memory controller 100 and the semiconductor memory device 201a may be formed as a separate semiconductor chip or as a separate group of chips (e.g., the memory controller 100 and the semiconductor memory device 201a may be packaged together in stacking form of the semiconductor chips). The memory controller 100 and the semiconductor memory device 201a may be connected to each other through corresponding command pins 101 and 205, corresponding address pins 102 and 206, corresponding data pins 103 and 207 and corresponding separate pins 104 and 208. The command pins 101 and 205 may transmit a command signal CMD through a command transmission line TL1, the address pins 102 and 206 may transmit an address signal ADDR through an address transmission line TL2, and the data pins 103 and 207 may exchange main data MD in a normal mode or may transmit a test pattern data TP in a test mode through a data transmission line TL3. The separate pins 104 and 208 may transmit a fail information signal FIS through a separate transmission line TL4. The memory controller 100 may receive the fail information signal FIS including pass/fail information on a data stream read from the memory cell array of the semiconductor memory device 201a and additional information on the data stream and may determine a repair policy of 'fail' cells based on the fail information signal FIS. The additional information in the fail information signal FIS indicates whether a number of the 'fail' cells in the memory cell array is a single-bit error or a multi-bit error and positions of the 'fail' cells.

Figure 2B:
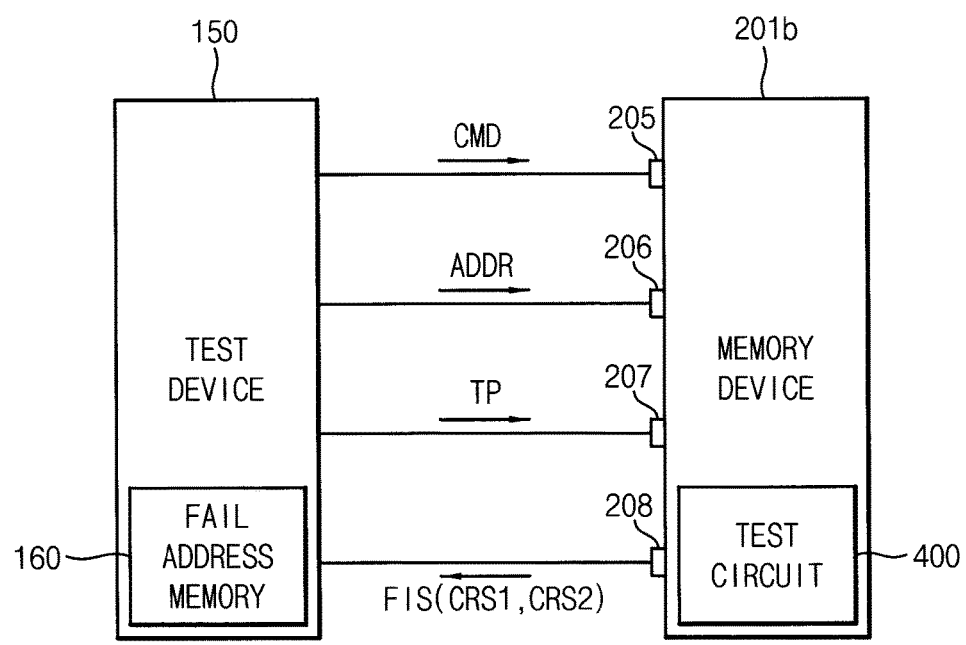
FIG. 2B is a block diagram illustrating a memory system according to example embodiments.

FIG. 2B is a block diagram illustrating a memory system according to example embodiments.

Referring to FIG. 2B, a memory system 25 may include a test device 150 and a semiconductor memory device 201b.

The test device 150, in a test mode of the semiconductor memory device 201b, applies a command CMD indicating the test mode to the semiconductor memory device 201b through a command pin 205, applies an address ADDR designating memory cells to be tested to the semiconductor memory device 201b through an address pin 206, applies a test pattern data TP to the semiconductor memory device 201b through a data pin 207, and receives the fail information signal FIS associated with the test result from the semiconductor memory device 201b through a separate pin 208. The test device 150 may receive the fail information signal FIS including pass/fail information on a data stream read from the memory cell array of the semiconductor memory device 201b and additional information on the data stream, from the semiconductor memory device 201b and may determine a repair policy of fail cells based on the fail information signal FIS. The additional information in the fail information signal FIS indicates whether a number of the fail cells in a memory region of the memory cell array, corresponding to the data stream, is a single-bit error or a multi-bit error and positions of the fail cells. For example, the data stream may be stored in the memory region of the memory cell array.

Figure 3A:
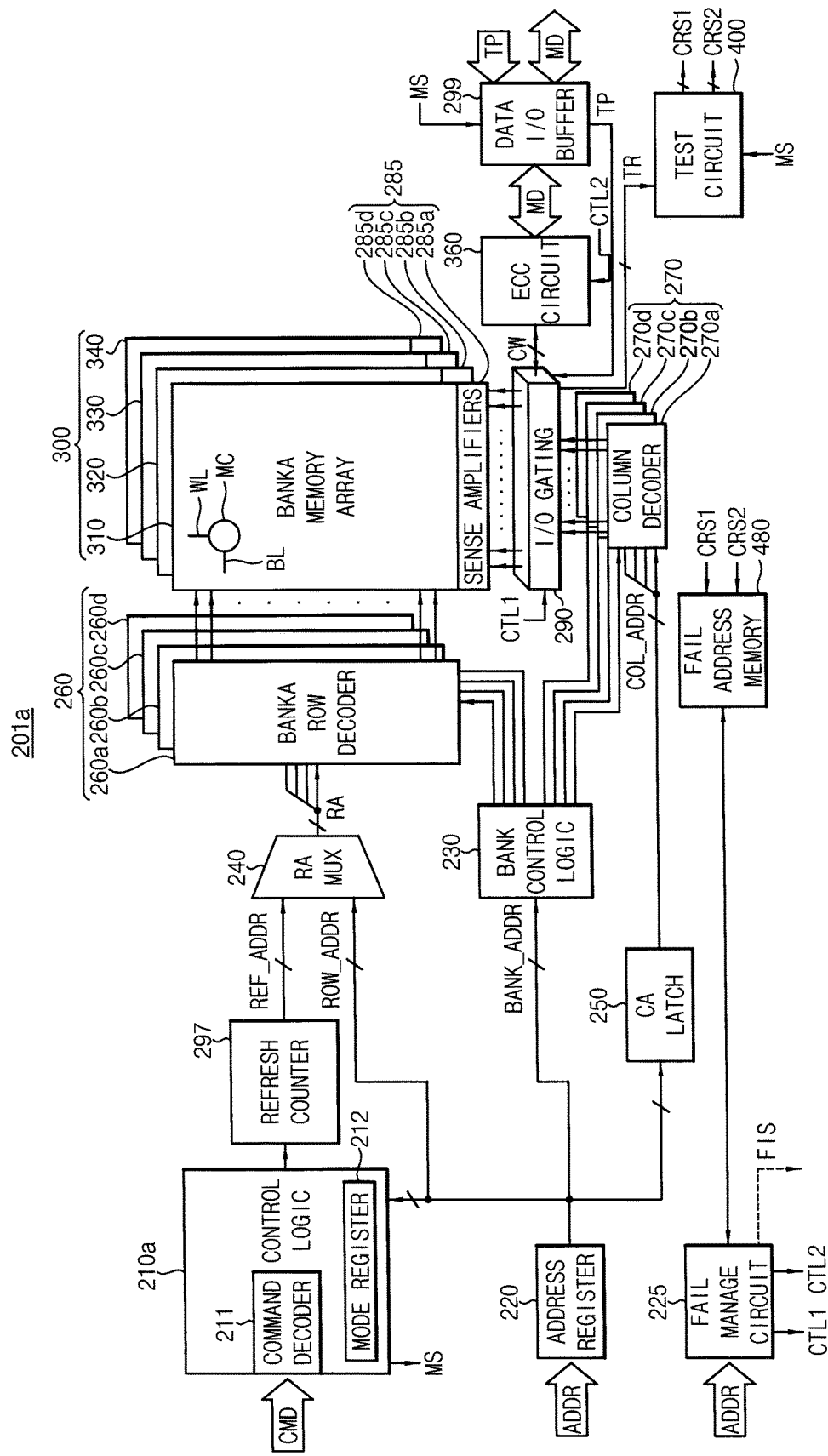
FIG. 3A is a block diagram illustrating the semiconductor memory device shown in FIG. 2A, according to example embodiments.

FIG. 3A is a block diagram illustrating the semiconductor memory device shown in FIG. 2A, according to example embodiments.

Referring to FIG. 3A, the semiconductor memory device 201a may include a control logic (or a control logic circuit) 210a, an address register 220, a fail manage circuit 225, a bank control logic 230, a refresh counter 297, a row address multiplexer 240, a column address latch 250, a row decoder 260, a column decoder 270, a memory cell array 300, a sense amplifier unit 285, an input/output (I/O) gating circuit 290, an error correction code (ECC) circuit 360, a data input/output (I/O) buffer 299, a test circuit 400 and a fail address memory 480.

The memory cell array 300 may include first through fourth bank arrays 310~340. The row decoder 260 may include first through fourth bank row decoders 260a~260d respectively coupled to the first through fourth bank arrays 310~340, the column decoder 270 may include first through fourth bank column decoders 270a~270d respectively coupled to the first through fourth bank arrays 310~340, and the sense amplifier unit 285 may include first through fourth bank sense amplifiers 285a~280d respectively coupled to the first through fourth bank arrays 310~340. Each of the first through fourth bank arrays 310~340 may include a plurality of memory cells MC, and each of memory cells MC is coupled to a corresponding word-line WL and a corresponding bit-line BL. The first through fourth bank arrays 310~340, the first through fourth bank row decoders 260a~260d, the first through fourth bank column decoders 270a~270d and first through fourth bank sense amplifiers 285a~280d may form first through fourth banks Although the semiconductor memory device 201a shown in FIG. 3A illustrates four banks, the semiconductor memory device 200a may include other number of banks.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a~260d corresponding to the bank address BANK_ADDR may be activated in response to the bank control signals, and one of the first through fourth bank column decoders 270a~270d corresponding to the bank address BANK_ADDR may be activated in response to the bank control signals.

The refresh counter 297 may generate a refresh row address REF_ADDR for refreshing memory cell rows in the memory cell array 300 under control of the control logic 210.

The row address multiplexer 240 may receive the row address ROW_ADDR from the address register 220, and may receive the refresh row address REF_ADDR from the refresh counter 297. The row address multiplexer 240 may selectively output the row address ROW_ADDR or the refresh row address REF_ADDR as a row address RA. The row address RA that is output from the row address multiplexer 240 may be applied to the first through fourth bank row decoders 260a~260d.

The activated one of the first through fourth bank row decoders 260a~260d may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address to the first through fourth bank column decoders 270a~270d.

The activated one of the first through fourth bank column decoders 270a~270d may decode the column address COL_ADDR that is output from the column address latch 250, and may control the I/O gating circuit 290 in order to output data corresponding to the column address COL_ADDR.

The I/O gating circuit 290 may include a circuitry for gating input/output data. The I/O gating circuit 290 may further include read data latches for storing data that is output from the first through fourth bank arrays 310~340, and write drivers for writing data to the first through fourth bank arrays 310~340.

Codeword CW read from one bank array of the first through fourth bank arrays 310~340 may be sensed by sense amplifiers coupled to the one bank array from which the data is to be read, and may be stored in the read data latches. The codeword CW stored in the read data latches may be provided to the memory controller 100 via the ECC circuit 360 and the data I/O buffer 299. Main data MD to be written in one bank array of the first through fourth bank arrays 310~340 may be provided to the data I/O buffer 299 from the memory controller 100. The main data MD provided to the data I/O buffer 299 is encoded to the codeword CW in the ECC circuit 360. The write driver may write the codeword CW in one bank array of the first through fourth bank arrays 310~340.

The data I/O buffer 299 receives test pattern data TP from an external test device in a test mode, provides the test pattern data TP to the I/O gating circuit 290. The I/O gating circuit 290 writes the test pattern data TP to a target page of the memory cell array 300 on codeword basis and reads the test pattern data TP from the target page to provide test result data TR to the test circuit 400 in a test mode.

The test circuit 400, on comparing bits of each first unit in the test result data TR to output a first result signal CRS1, compares corresponding bits in the first units as each second unit and to output a second result signal CRS2.

The ECC circuit 360 generates parity data based on the main data MD from the data I/O buffer 299 in a write operation, and provides the I/O gating circuit 290 with the codeword CW including the main data MD and the parity data. The I/O gating circuit 290 writes the codeword CW to the target page of the memory cell array 300. In addition, in a read operation, the ECC circuit 360 receives the codeword CW which is read from the target page from the I/O gating circuit 290. The ECC circuit 360 decodes the main data MD using the parity data in the codeword CW, corrects a single bit error in the main data MD and provides the data I/O buffer 299 with the error-corrected main data.

The fail address memory 480 stores the first result signal CRS1 and the second result signal CRS2 on codeword basis.

The fail manage circuit 225 repairs 'fail' cells by one of an ECC operation and a redundancy repair operation based on a number of the 'fail' cells, included in an access address, by referring to the fail address memory 480, in a normal mode of the semiconductor memory device 201a. For repairing the 'fail' cells by one of the ECC operation and the redundancy repair operation, the fail manage circuit 225 provides a first control signal CTL1 to the I/O gating circuit 290 and provides a second control signal CTL2 to the ECC circuit 360 by referring to the fail address memory 480. In addition, the fail manage circuit 225 may provide the memory controller 100 with the fail information signal FIS including the first result signal CRS1 and the second result signal CRS2.

The control logic 210a may control operations of the semiconductor memory device 201a. For example, the control logic 210a may generate control signals for the semiconductor memory device 201a in order to perform a write operation or a read operation. The control logic 210a may include a command decoder 211 that decodes a command CMD received from the memory controller 100 and a mode register 212 that sets an operation mode of the semiconductor memory device 201a.

For example, the command decoder 211 may generate the control signals corresponding to the command CMD by decoding a write enable signal (/WE), a row address strobe signal (/RAS), a column address strobe signal (/CAS), a chip select signal (/CS), etc. The command decoder 211 may generate a mode signal MS directing an operation mode of the semiconductor memory device 201a by decoding the command CMD. The control logic 210a may provide the mode signal MS to the data I/O buffer 299 and the test circuit 400.

Figure 3B:
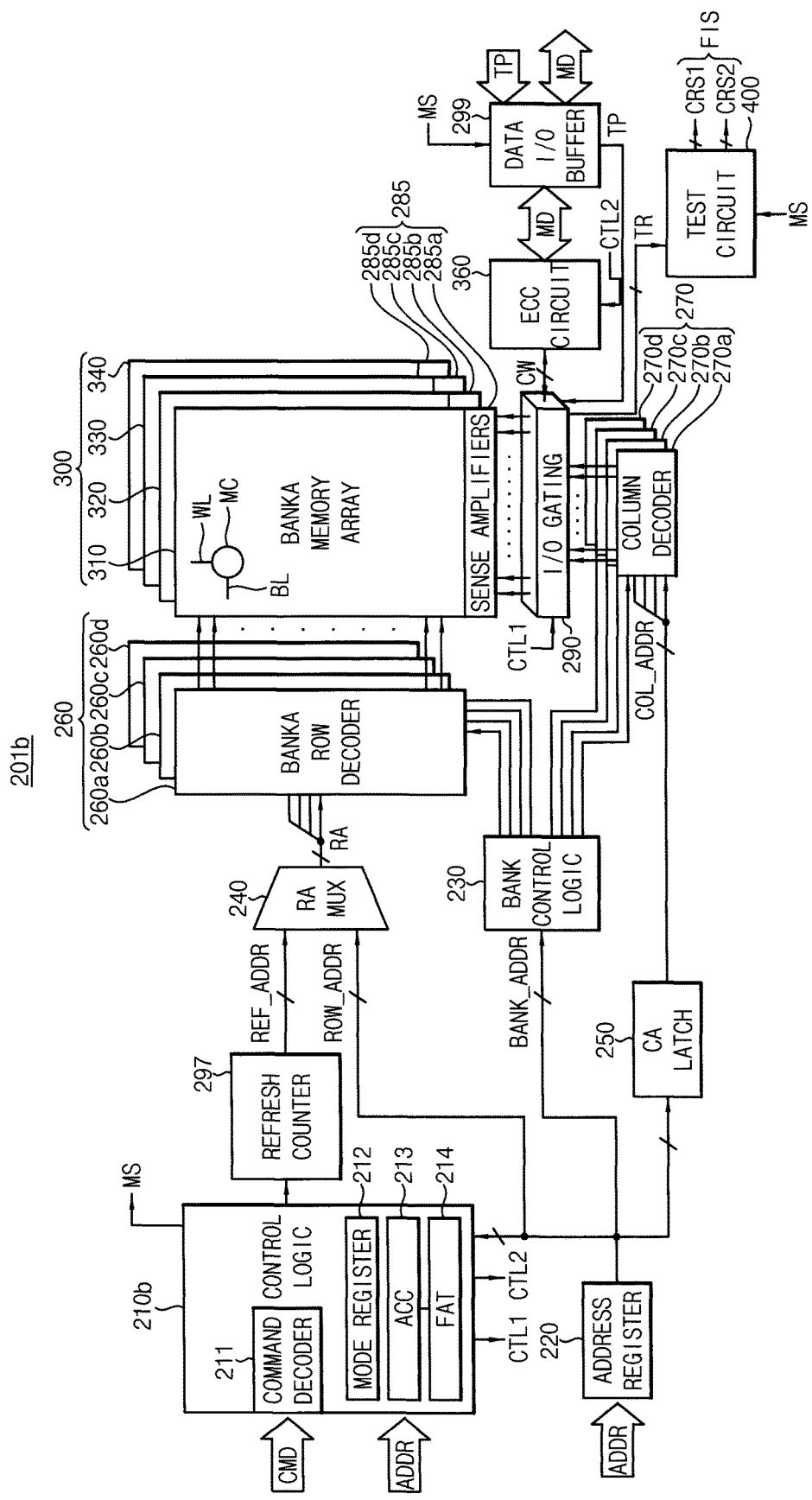
FIG. 3B is a block diagram illustrating the semiconductor memory device shown in FIG. 2B, according to example embodiments.

FIG. 3B is a block diagram illustrating the semiconductor memory device shown in FIG. 2B, according to example embodiments.

A semiconductor memory device 201b of FIG. 3B is substantially similar to the semiconductor memory device 201a of FIG. 3A. The semiconductor memory device 201b of FIG. 3B differs from the semiconductor memory device 201a of FIG. 3A in that the semiconductor memory device 201b does not include the fail manage circuit 225 and the fail address memory 480 and includes a control logic 210b instead of the control logic 210a.

Referring to FIG. 3B, the semiconductor memory device 201b may include a control logic 210b, an address register 220, a bank control logic 230, a refresh counter 297, a row address multiplexer 240, a column address latch 250, a row decoder 260, a column decoder 270, a memory cell array 300, a sense amplifier unit 285, an input/output (I/O) gating circuit 290, an ECC circuit 360, a data input/output (I/O) buffer 299 and a test circuit 400.

The control logic 210b may control operations of the semiconductor memory device 201b. The control logic 210b may include a command decoder 211 that decodes a command CMD received from the memory controller 100 and a mode register 212 that sets an operation mode of the semiconductor memory device 201b. In addition, the control logic 210b may include an address comparison circuit 213 and a fail address table 214. The fail address table 214 may store fail addresses of 'fail' cells based on the first result signal CRS1 and the second result signal CRS2 provided from the test circuit 400 in a test mode. The control logic 210b may generate the first control signal CTL1 and the second control signal CTL2 for repairing the 'fail' cells by one of the ECC operation and the redundancy repair operation by comparing the access address ADDR and each of the fail addresses stored in the fail address table 214 using the address comparison circuit 212 in a normal mode.

The ECC operation and the redundancy repair operation performed by the control logic 210b for repairing the 'fail' cells is substantially the same as operation of the fail manage circuit 225, and detailed description on the ECC operation and the redundancy repair operation performed by the control logic 210b will be omitted.

FIGS. 4A to 4E are circuit diagrams of examples of the memory cell shown in FIG. 3A, according to example embodiments.

Figure 4A:
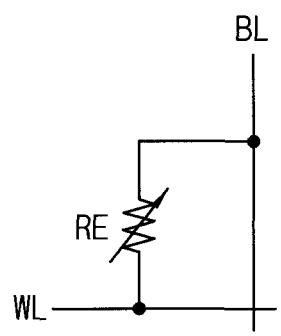
FIGS. 4A to 4E are circuit diagrams of examples of the memory cell shown in FIG. 3A, according to example embodiments.
Figure 4B:
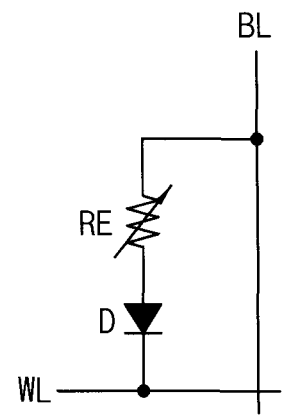
Figure 4C:
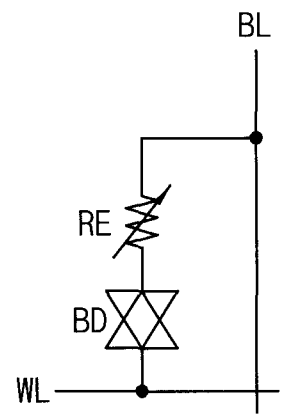
Figure 4D:
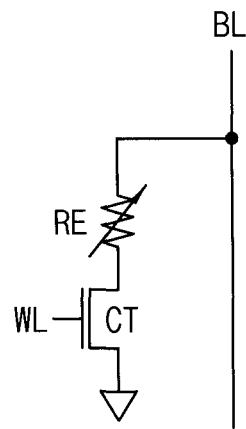
Figure 4E:
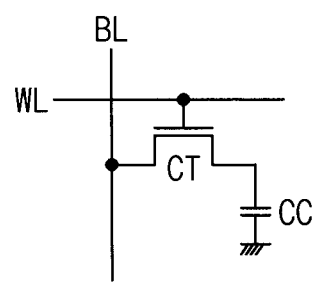

FIGS. 4A to 4D illustrate memory cells MC which are implemented with resistive type memory cells and FIG. 4E illustrates a memory cell MC which is implemented with a dynamic memory cell.

FIG. 4A illustrates a resistive type memory cell without a selection element, while FIGS. 4B to 4D show resistive type memory cells each comprising a selection element.

Referring to FIG. 4A, a memory cell MC may include a resistive element RE connected to a bit-line BL and a word-line WL. Such a resistive memory cell having a structure without a selection element may store data by a voltage applied between bit-line BL and word-line WL.

Referring to FIG. 4B, a memory cell MC may include a resistive element RE and a diode D. The resistive element RE may include a resistive material for data storage. The diode D may be a selection element (or switching element) that supplies current to resistive element RE or cuts off the current supply to resistive element RE according to a bias of word-line WL and bit-line BL. The diode D may be coupled between the resistive element RE and word-line WL, and the resistive element RE may be coupled between the bit-line BL and the diode D. Positions of the diode D and the resistive element RE may be interchangeable. The diode D may be turned on or turned off by a word-line voltage. Thus, a resistive memory cell may be not driven where a voltage of a constant level or higher is supplied to an unselected word-line WL.

Referring to FIG. 4C, a memory cell MC may include a resistive element RE and a bidirectional diode BD. The resistive element R may include a resistive material for data storage. The bidirectional diode BD may be coupled between the resistive element RE and a word-line WL, and the resistive element RE may be coupled between a bit-line BL and bidirectional diode BD. Positions of the bidirectional diode BD and the resistive element RE may be interchangeable. The bidirectional diode BD may block leakage current flowing to an unselected semiconductor memory cell.

Referring to FIG. 4D, a memory cell MC may include a resistive element RE and a transistor CT. The transistor CT may be a selection element (or switching element) that supplies current to the resistive element RE or cuts off the current supply to the resistive element RE according to a voltage of a word-line WL. The transistor CT may be coupled between the resistive element RE and a word-line WL, and the resistive element RE may be coupled between a bit-line BL and the transistor CT. Positions of the transistor CT and the resistive element RE may be interchangeable. The semiconductor memory cell may be selected or unselected depending on whether the transistor CT drive by word-line WL is turned on or turned off.

Referring to FIG. 4E, a memory cell MC may include a cell capacitor CC and a transistor CT. The transistor CT may be a selection element (or switching element) that connects/disconnects the cell capacitor CC to/from bit-line BL according to a voltage of a word-line WL. The transistor CT may be coupled between the cell capacitor CC, a word-line WL and a bit-line BL, and the cell capacitor CC may be coupled between the transistor CT and a plate voltage (not illustrated).

Figure 5:
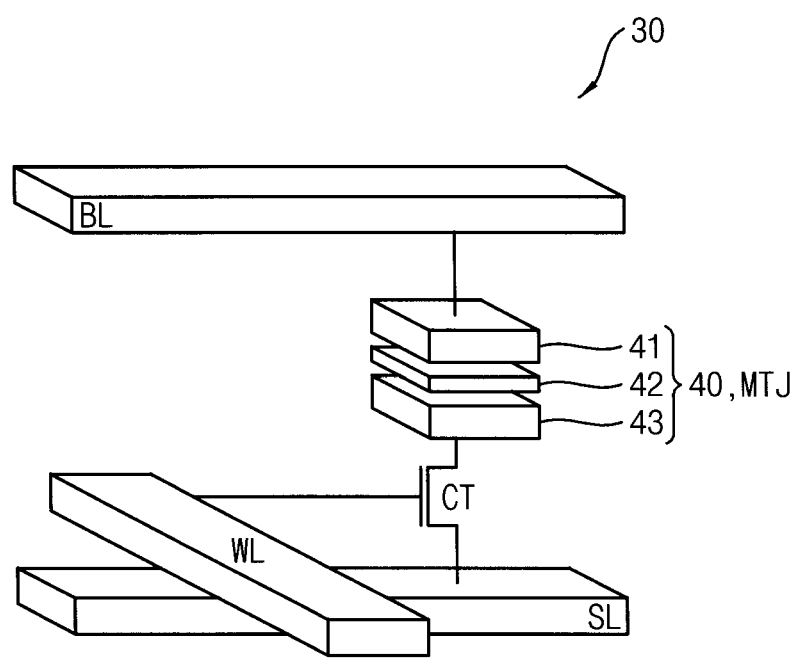
FIG. 5 illustrates an example of the memory cell (referred to as STT-MRAM cell) shown in FIG. 3A, according to example embodiments.

FIG. 5 illustrates an example of the memory cell (referred to as STT-MRAM cell) shown in FIG. 3A, according to example embodiments.

Referring to FIG. 5, an STT-MRAM cell 30 may include a MTJ element 40 and a cell transistor CT. A gate of the cell transistor CT is connected to a word-line WL and one electrode of the cell transistor CT is connected through the MTJ 40 to a bit-line BL. Also, the other electrode of the cell transistor CT is connected to a source line SL.

The MTJ element 40 may include the free layer 41, the pinned layer 43, and a tunnel layer 42 disposed between the free layer 41 and the pinned layer 43. A magnetization direction of the pinned layer 43 may be fixed, and a magnetization direction of the free layer 41 may be parallel to or anti-parallel to the magnetization direction of the pinned layer 43 according to written data. In order to fix the magnetization direction of the pinned layer 43, for example, an anti-ferromagnetic layer (not shown) may be further provided.

In order to perform a write operation of the STT-MRAM cell 30, a logic high voltage is applied to the word-line WL to turn on the cell transistor CT. A program current, for example, a write current is applied to the bit-line BL and the source line SL. A direction of the write current is determined by a logic state of the MTJ element 40.

In order to perform a read operation of the STT-MRAM cell 30, a logic high voltage is applied to the word-line WL to turn on the cell transistor CT, and a read current is supplied to the bit-line BL and the source line SL. Accordingly, a voltage is developed at both ends of the MTJ element 40, is detected by the sense amplifier 285a, and is compared with a reference voltage from a reference voltage to determine a logic state of the MTJ element 40. Accordingly, data stored in the MTJ element 40 may be detected.

Figure 6A:
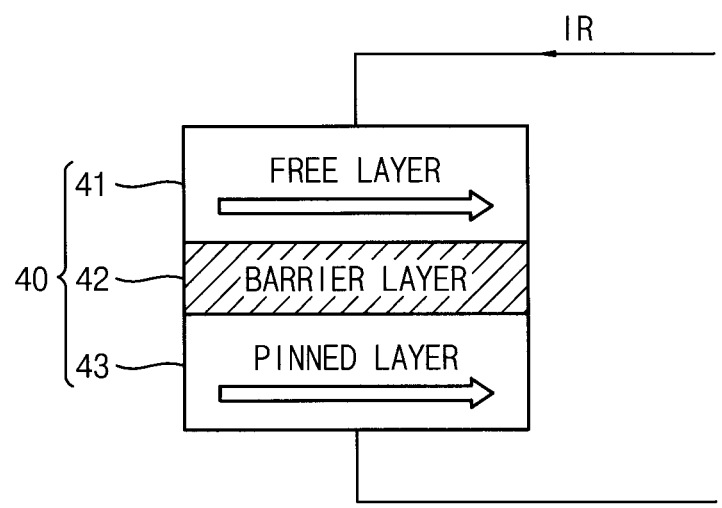
FIGS. 6A and 6B illustrate a magnetization direction according to data written in the MTJ element shown in FIG. 5, according to example embodiments.
Figure 6B:
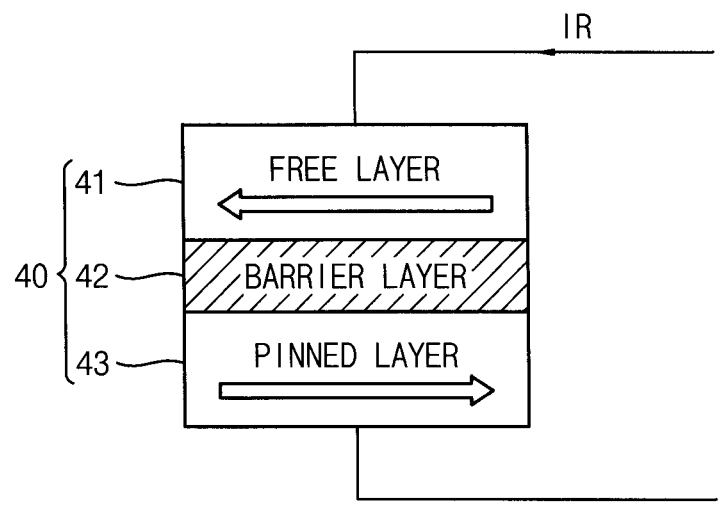

FIGS. 6A and 6B illustrate a magnetization direction according to data written to the MTJ element shown in FIG. 5.

A resistance value of the MTJ element 40 may vary according to a magnetization direction of the free layer 41. When a read current IR flows through the MTJ 40, a data voltage is output according to the resistance value of the MTJ element 40. Since the read current IR is much smaller than a write current, a magnetization direction of the free layer 41 is not changed by the read current IR.

Referring to FIG. 6A, a magnetization direction of the free layer 41 and a magnetization direction of the pinned layer 43 of the MTJ element 40 are parallel. Accordingly, the MTJ element 40 may have a high resistance value. In this case, the MTJ element 40 may read data '0'.

Referring to FIG. 6B, a magnetization direction of the free layer 41 and a magnetization direction of the pinned layer 43 of the MTJ element 40 are anti-parallel. Accordingly, the MTJ element 40 may have a high resistance value. In this case, the MTJ element 40 may read data '1'.

Although the free layer 41 and the pinned layer 43 of the MTJ element 40 are horizontal magnetic layers, example embodiments are not limited thereto and the free layer 41 and the pinned layer 43 may be, for example, vertical magnetic layers.

Figure 7:
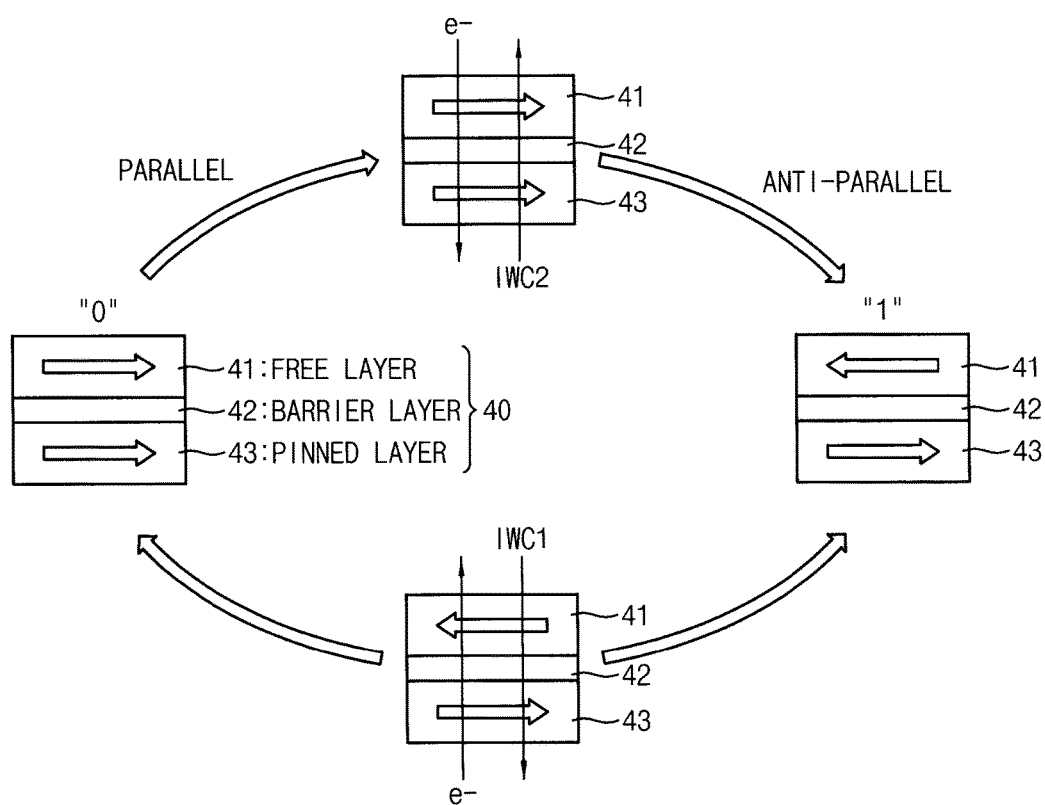
FIG. 7 is a block diagram for explaining a write operation of the STT-MRAM cell shown in FIG. 5, according to example embodiments.

FIG. 7 is a block diagram for explaining a write operation of the STT-MRAM cell shown in FIG. 5, according to example embodiments.

Referring to FIG. 7, a magnetization direction of the free layer 41 may be determined based on a direction of a write current IW flowing through the MTJ element 40. For example, when a first write current IWC1 is supplied from the free layer 41 to the pinned layer 43, free electrons having the same spin direction as that of the pinned layer 43 apply a torque to the free layer 41. Accordingly, the free layer 41 may be magnetized parallel to the pinned layer 43.

When a second write current IWC2 is applied from the pinned layer 43 to the free layer 41, electrons having a spin direction opposite to that of the pinned layer 41 return to the free layer 43 and apply a torque. Accordingly, the free layer 41 may be magnetized anti-parallel to the pinned layer 43. For example, a magnetization direction of the free layer 41 of the MTJ element 40 may be changed by an STT.

Figure 8:
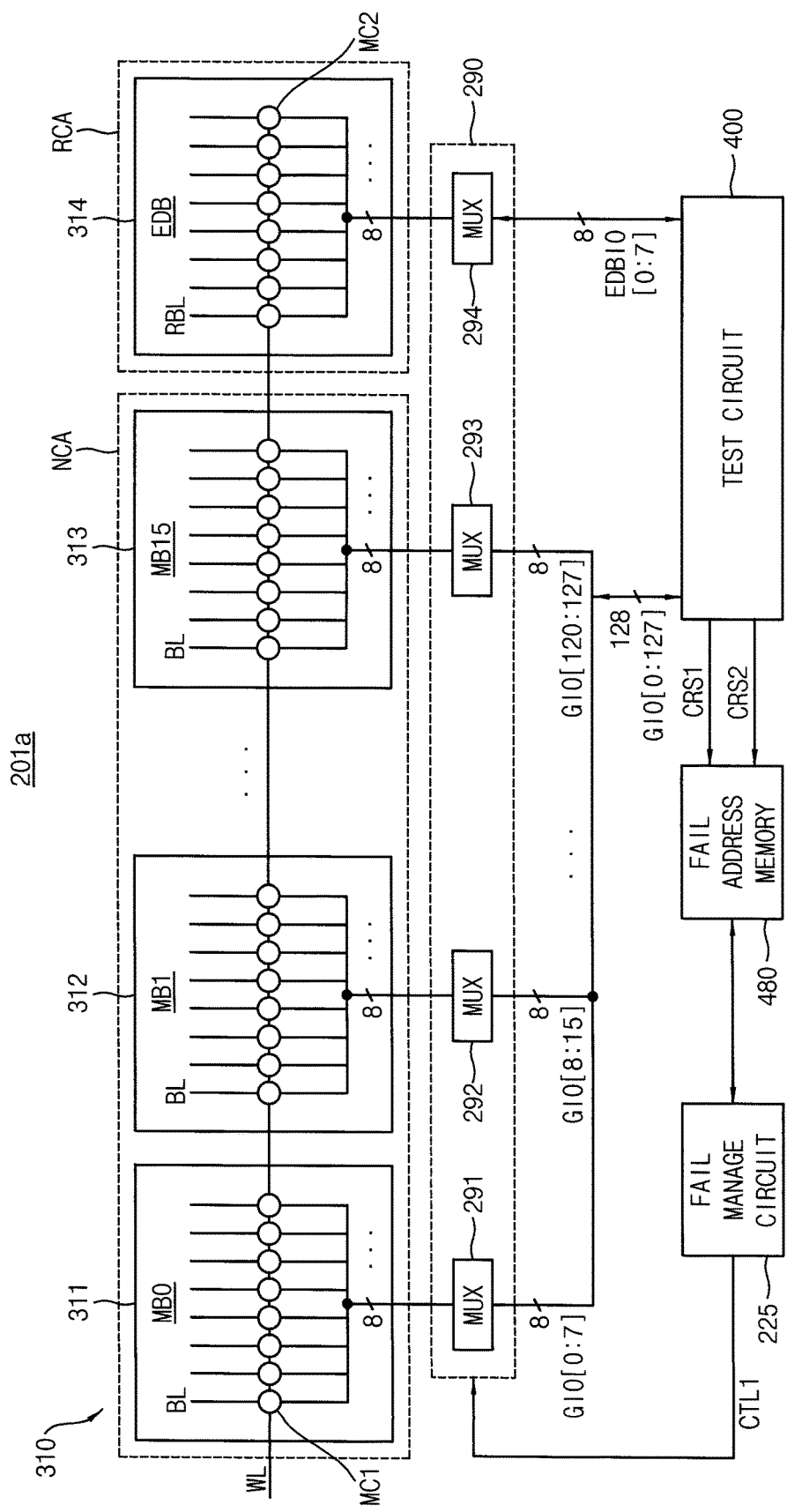
FIG. 8 illustrates a portion of the semiconductor memory device of FIG. 3A in a test mode, according to example embodiments.

FIG. 8 illustrates a portion of the semiconductor memory device of FIG. 3A in a test mode, according to example embodiments.

In FIG. 8, the first bank array 310, the I/O gating circuit 290, the test circuit 400, the fail address memory 480 and the fail manage circuit 225 are illustrated.

Referring to FIG. 8, the first bank array 310 may include a normal cell array NCA and a redundancy cell array RCA. The normal cell array NCA may include a plurality of first memory blocks MB0~MB15, i.e., 311~313, and the redundancy cell array RCA may include at least a second memory block 314. The first memory blocks 311~313 are memory blocks determining a memory capacity of the semiconductor memory device 201a. The second memory block 314 is for ECC and/or redundancy repair. Since the second memory block 314 for ECC and/or redundancy repair is used for ECC, data line repair and block repair to repair 'fail' cells generated in the first memory blocks 311~313, the second memory block is also referred to as an EDB block.

In each of the first memory blocks 311~313, a plurality of first memory cells MC1 are arrayed in rows and columns. In the second memory block 314, a plurality of second memory cells MC2 are arrayed in rows and columns.

In the first memory blocks 311~313, rows may be formed, for example, of 8K word-lines WL and columns may be formed, for example, of 1K bit-lines BL. Memory cells connected to intersections of the word-lines WL and the bit-lines BL may be dynamic memory cells or resistive type memory cells.

The I/O gating circuit 290 includes a plurality of switching circuit 291~294 circuits respectively connected to the first memory blocks 311~313 and the second memory block 314. In the semiconductor memory device 201a, bit lines corresponding to data of a burst length (BL) may be simultaneously accessed to support the BL indicating the maximum number of column locations that is accessible. For example, if the BL is set to 8, data bits may be set to 128 bits.

The test circuit 400 is connected to the switching circuit 291~294 through corresponding first data lines GIO[0:127] and second data lines EDBIO[0:7]. The test circuit 400, in a test mode, reads test pattern data from the first memory blocks 311~313 and the second memory block 314, on comparing bits of each first unit in the read test pattern data to output the first result signal CRS1, compares corresponding bits in the first units as each second unit and to output the second result signal CRS2.

The fail address memory 480 stores the first result signal CRS1 and the second result signal CRS2 on codeword basis.

The fail manage circuit 225, in response to the mode signal MS indicating a test mode, applies the first control signal CTL1 to the switching circuits 291~294 such that the test pattern data is written in the first memory blocks 291293 and the second memory block 294 on codeword basis.

Figure 9:
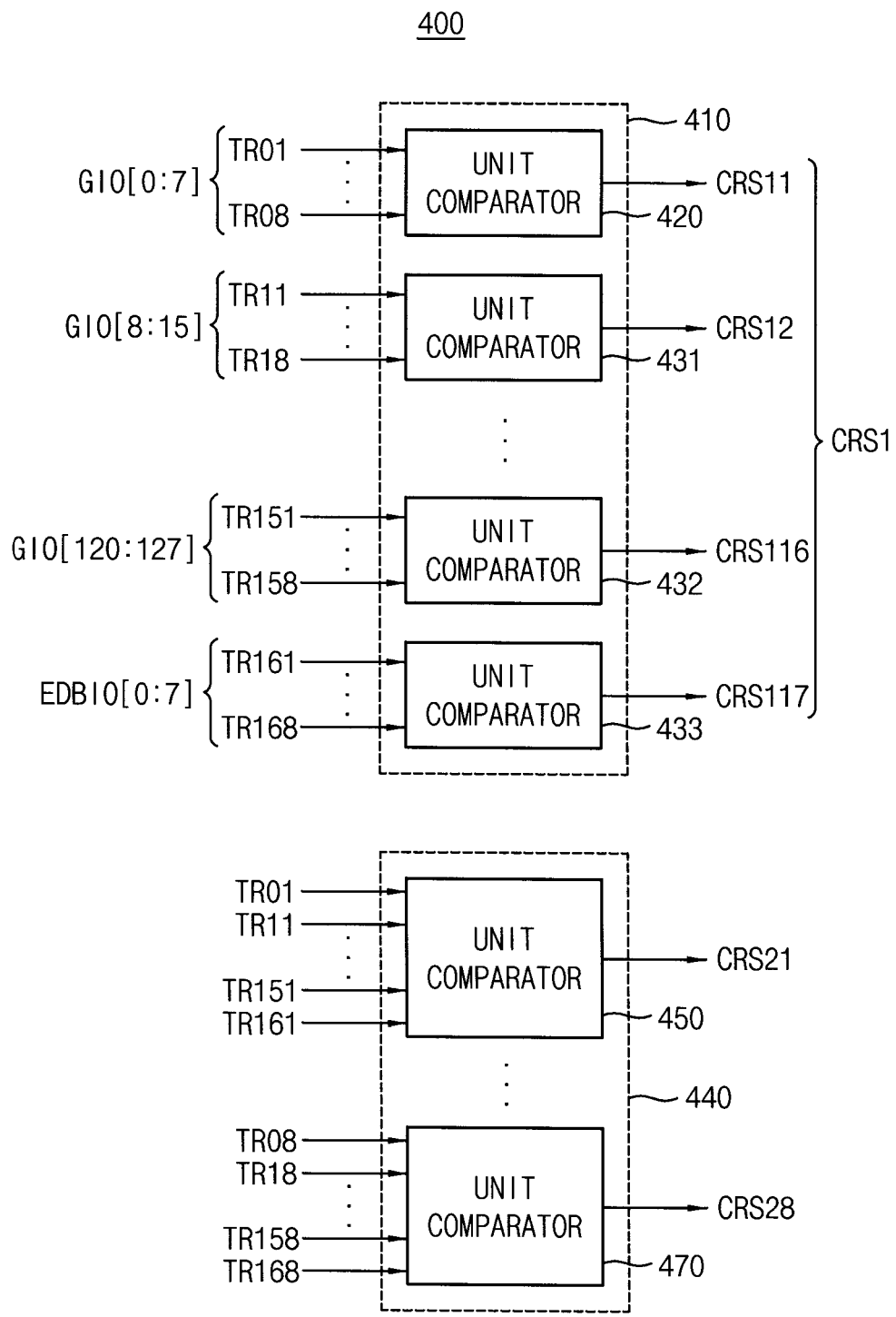
FIG. 9 is a block diagram illustrating the test circuit shown in the semiconductor memory device of FIG. 8, according to example embodiments.

FIG. 9 is a block diagram illustrating the test circuit shown in the semiconductor memory device of FIG. 8, according to example embodiments.

Referring to FIG. 9, the test circuit 400 includes a first comparison circuit 410 and a second comparison circuit 440.

The first comparison circuit 410 may compare the bits of each first unit in the read test pattern data to output the first result signal CRS1 and the second comparison circuit 440 may compare corresponding bits in the first units as each second unit and to output the second result signal CRS2. The first unit may correspond to the burst length of the semiconductor memory device 201a.

The first comparison circuit 410 may include a plurality of first unit comparators 420 and 431~433 and the second comparison circuit 440 may include a plurality of second unit comparators 450 and 470.

The unit comparator 420 receives the first unit of test result data TR01~TR08, i.e., the read test pattern data from the memory block 311 through the data line GIO[0:7] and compares whether the first unit of test result data TR01~TR08 are same with respect to each other to output a first bit CRS11 of the first result signal CRS1, which indicates the comparison result. The unit comparator 431 receives the first unit of test result data TR11~TR18 from the memory block 312 through the data line GIO[8:15] and compares whether the first unit of test result data TR11~TR18 are same with respect to each other to output a second bit CRS12 of the first result signal CRS1, which indicates the comparison result. The unit comparator 432 receives the first unit of test result data TR151~TR158 from the memory block 313 through the data line GIO[120:127] and compares whether the first unit of test result data TR151~TR158 are same with respect to each other to output a sixteenth bit CRS116 of the first result signal CRS1, which indicates the comparison result. The unit comparator 433 receives the first unit of test result data TR151~TR168 from the second memory block 314 through the second data line EDBIO[0:7] and compares whether the first unit of test result data TR161~TR168 are same with respect to each other to output a seventeenth bit CRS117 of the first result signal CRS1, which indicates the comparison result.

The unit comparator 450 compares whether first bits TR01, TR11, . . . , TR151, TR161 in the first units of test result data as the second unit are same with respect to each other and outputs a first bit CRS21 of the second result signal CRS2, which indicates the comparison result. The unit comparator 470 compares whether eighth bits TR08, TR18, . . . , TR158, TR168 in the first units of test result data as the second unit are same with respect to each other and outputs a eighth bit CRS28 of the second result signal CRS2, which indicates the comparison result.

Figure 10:
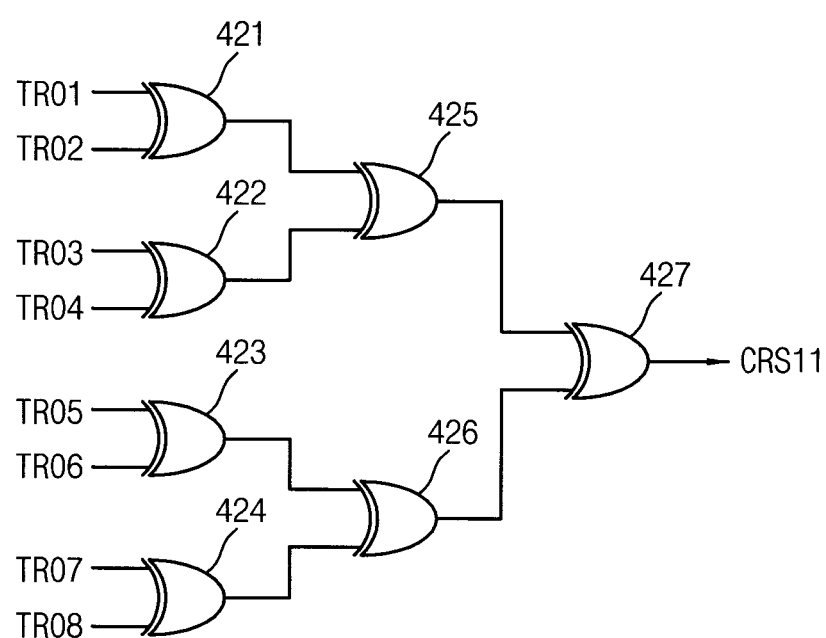
FIG. 10 illustrates one of the first unit comparators shown in FIG. 9, according to example embodiments.

FIG. 10 illustrates one of the first unit comparators shown in FIG. 9, according to example embodiments.

Although FIG. 10 illustrates the first unit comparator 420, each of the unit comparators 431, 432 and 433 has a substantially same configuration as the first unit comparator 420.

Referring to FIG. 10, the first unit comparator 420 includes a plurality of XOR gates 421~427.

Each of the XOR gates 421~424 compare two bits of the first unit of the test result data TR01~TR08. The XOR gate 425 compares outputs of the XOR gates 421 and 422, the XOR gate 426 compares outputs of the XOR gates 423 and 424, and XOR gate 427 compares outputs of the XOR gates 425 and 426 to output the first bit CRS11 of the first result signal CRS1, which indicates whether the test result data TR01~TR08 are same with respect to each other.

Each of the unit comparators 450 and 470 of the second comparison circuit 440 may have a similar configuration as the first unit comparator 420.

Figure 11:
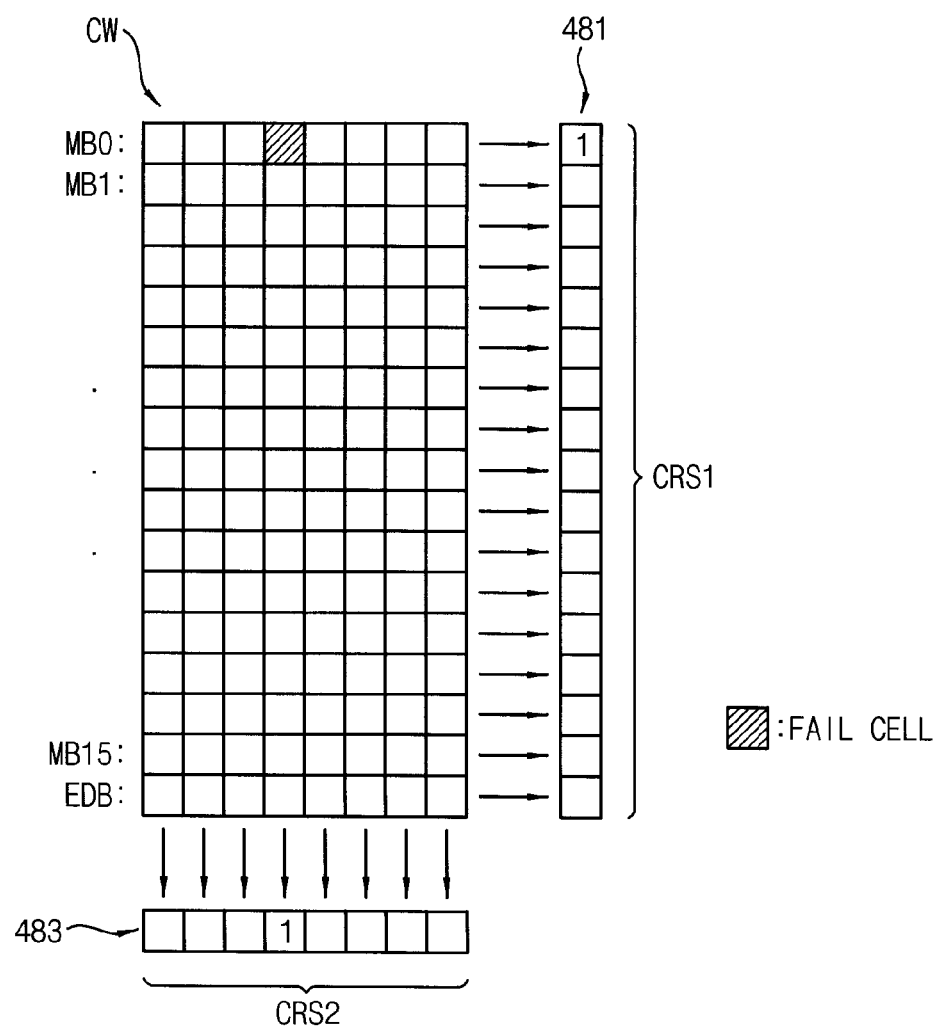
FIG. 11 illustrates an example of the fail address memory shown in FIG. 3A, according to example embodiments.

FIG. 11 illustrates an example of the fail address memory shown in FIG. 3A, according to example embodiments.

In FIG. 11, the test pattern data on codeword basis is also illustrated, which is written in the first bank array 310.

Referring to FIG. 11, the fail address memory 480 may include a first region 481 and a second region 483 that store bits of the first result signal CRS1 and bits of the second result signal respectively.

In FIG. 11, the memory block MB0 has a 'fail' cell, and thus, a first bit of the first result signal CRS1 and a fourth bit of the second result signal CRS2 have a logic high level. For example, a memory block having a 'fail' cell may be determined based on a logic level of each bit of the first result signal CRS1 and a location of the 'fail' cell may be determined based on a logic level of each bit of the second result signal CRS2.

Figure 12:
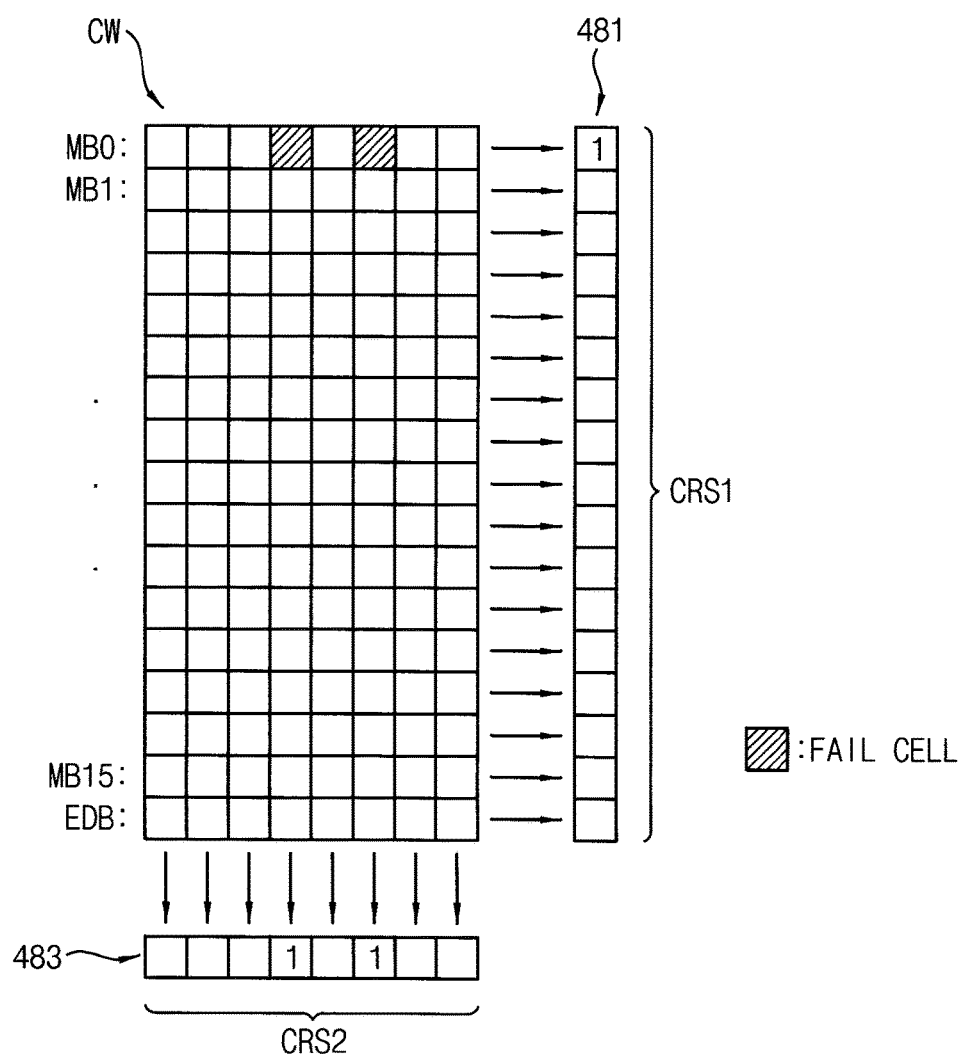
FIG. 12 illustrates another example of the fail address memory shown in FIG. 3A, according to example embodiments.

FIG. 12 illustrates another example of the fail address memory shown in FIG. 3A, according to example embodiments.

Referring to FIG. 12, the memory block MB0 has two 'fail' cells, and thus, a first bit of the first result signal CRS1 and a fourth bit and a sixth bit of the second result signal CRS2 have a logic high level. For example, a memory block having a 'fail' cell may be determined based on a logic level of each bit of the first result signal CRS1 and locations of the 'fail' cells may be determined based on a logic level of each bit of the second result signal CRS2.

Figure 13:
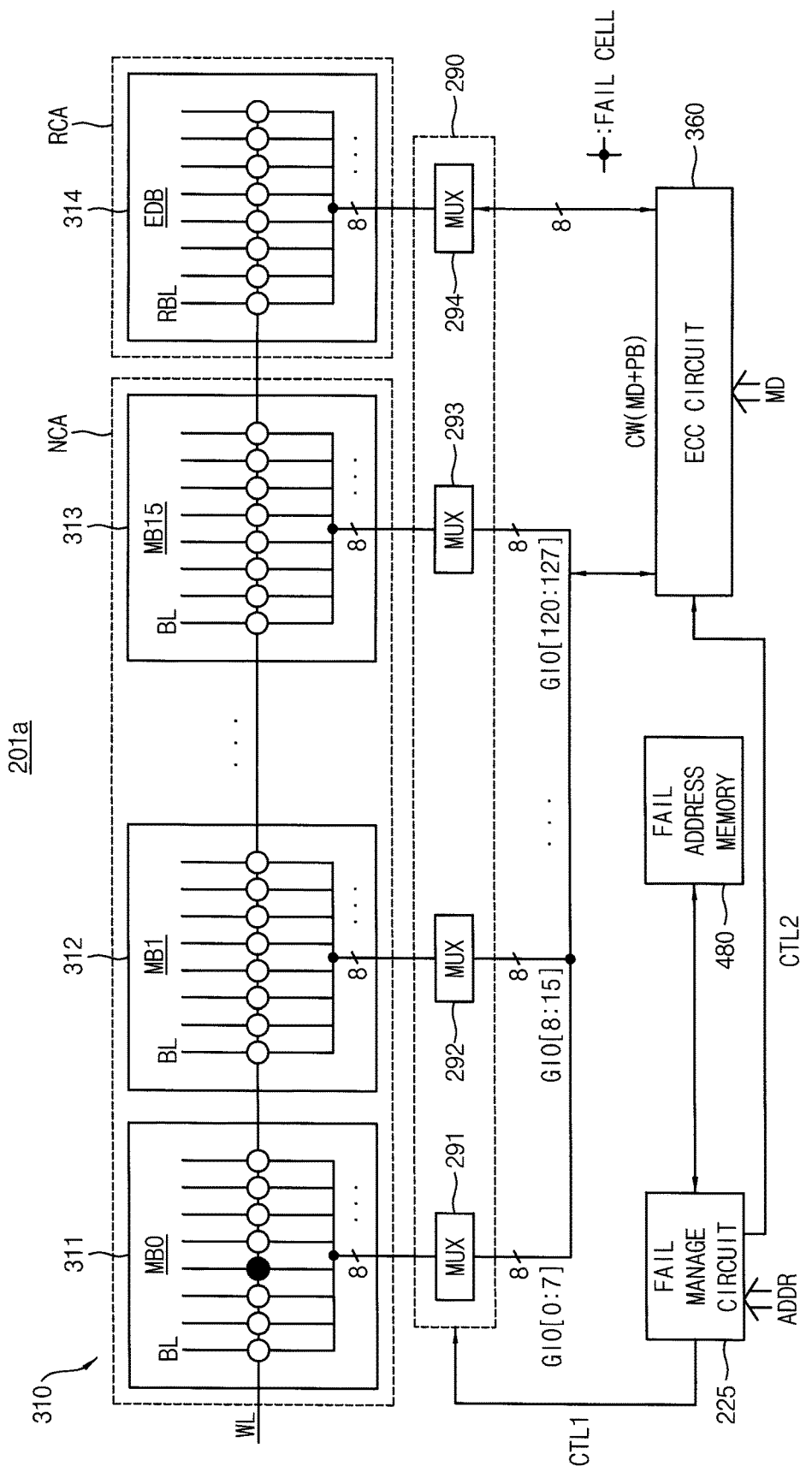
FIG. 13 illustrates a portion of the semiconductor memory device of FIG. 3A in a normal mode, according to example embodiments.

FIG. 13 illustrates a portion of the semiconductor memory device of FIG. 3A in a normal mode, according to example embodiments.

Operation of the semiconductor memory device 201a will be described with reference to FIG. 13, when the memory bloc MB0 has one 'fail' cell as shown in FIG. 11.

The fail manage circuit 225 receives the access address ADDR, and determines that one 'fail' cell exists in a memory region designated by the access address ADDR by referring to the fail address memory 480. Therefore, the fail manage circuit 225 generates the second control signal CTL2 to the ECC circuit 360 such that the ECC circuit 360 perform an ECC operation in which the ECC circuit 360 generates parity bits on the fail memory cell indicating a single bit error in one codeword and detects an error bit of the 'fail' cell to correct the error bit using the parity bits.

The main data MD to be written in the first memory blocks 311~313 is delivered to the data lines GIO[0:127] via the ECC circuit 360. 128-bit main data MD is written in the first memory blocks 311~313 through the switching circuits 291~293. Since the memory block MB0 has one 'fail' cell, the second memory block 314 is used for repairing one 'fail' cell in one codeword. 8 bit-lines RBL of the second memory block 314 are connected to the data lines EDBIO[0:7] through the switching circuit 291 and the data lines EDBIO[0:7] are connected to the ECC circuit 360. The ECC circuit 360 encodes the main data MD to generate the parity bits (or parity data) and the parity bits are stored/read in/from 8 memory cells in the second memory block 314.

When the memory region designated by the access address ADDR has one 'fail' cell, the fail manage circuit 225 generates the first control signal CTL1 to the switching circuits 291~294 and generates the second control signal CTL2 to the ECC circuit 360. The switching circuits 291~293 connect the first memory blocks 311~313 to the first data lines GIO[0:127] in response to the first control signal CTL1 and the switching circuit 294 connects the second memory block 314 to the second data lines EDBIO[0:7] in response to the first control signal CTL1. The ECC circuit 360 performs an ECC encoding and an ECC decoding in response to the second control signal CTL2.

The ECC circuit 360 detects and corrects a 'fail' cell in the first memory blocks 311~313 in response to the second control signal CTL2. During the write operation, the ECC circuit 360 generates parity bits regarding the main data MD in response to the second control signal CTRL2 and delivers the parity bits to the second data lines EDBIO[0:7]. The parity bits delivered to the second data lines EDBIO[0:7] are stored in memory cells of the second memory block 314, which are connected to the word-line WL to which the 'fail' cell is connected.

During the read operation, the ECC circuit 360 receives, in response to the second control signal CTRL2, the main data delivered via the first data lines GIO[0:127] and the parity bits delivered via the second data lines EDBIO[0:7]. The ECC circuit 360 generates syndrome data, calculates the location of the 'fail' cell, i.e., the location of an error bit, corrects data corresponding to the location of the error bit, and then outputs error-corrected main data MD, all based on the main data and the parity bits. The error-corrected main data MD is output to the outside of semiconductor memory device 201a via data I/O buffer 299.

In some embodiments, a 'fail' cell may occur in memory cells connected to other word-lines WL among the memory cells of the first memory blocks 311~313. In this case, the semiconductor memory device 201a detects and corrects a plurality of single-bit errors in the first memory blocks 311~313.

Figure 14:
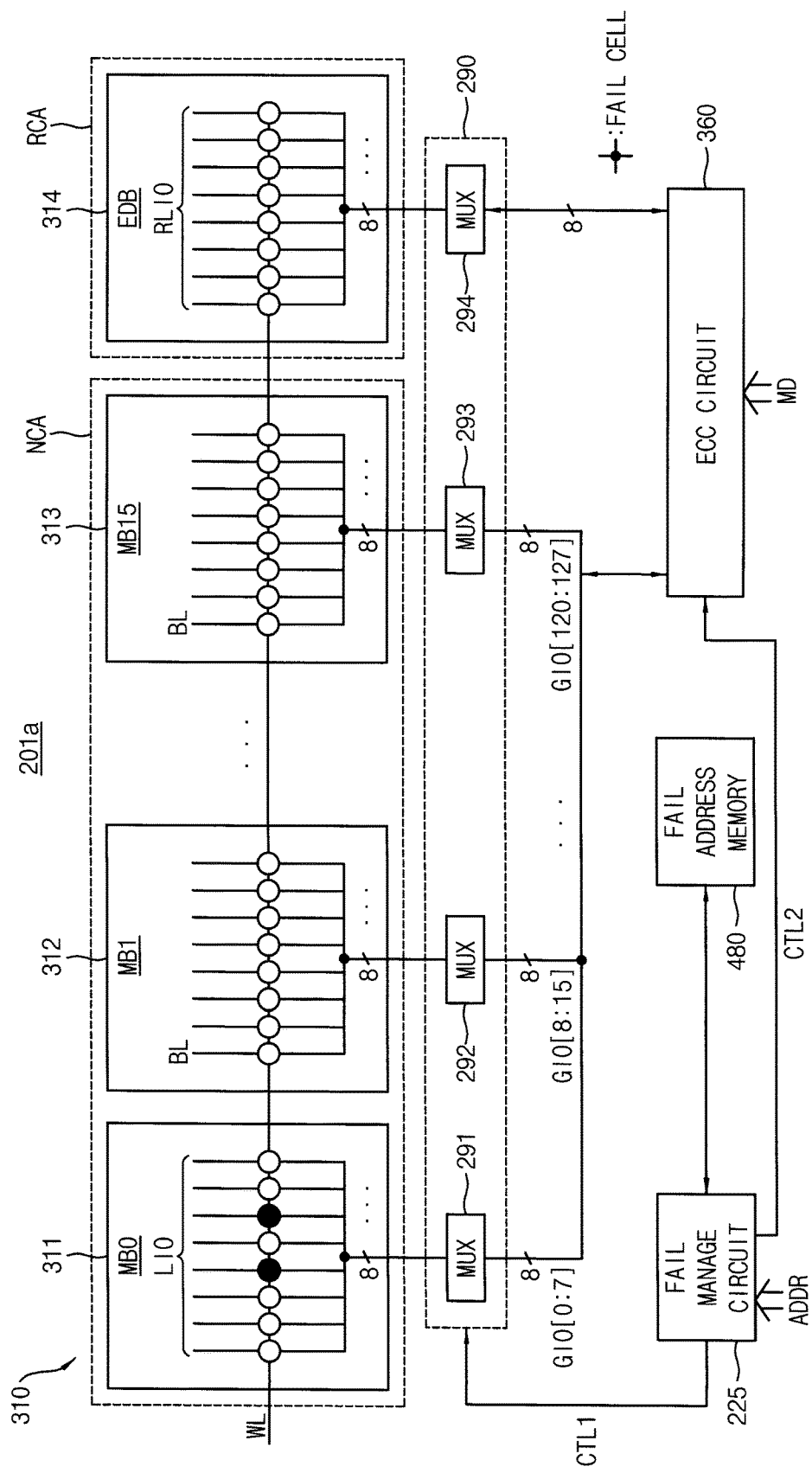
FIG. 14 illustrates a portion of the semiconductor memory device of FIG. 3A in a normal mode, according to example embodiments.

FIG. 14 illustrates a portion of the semiconductor memory device of FIG. 3A in a normal mode, according to example embodiments.

Operation of the semiconductor memory device 201a will be described with reference to FIG. 14, when the memory bloc MB0 has two 'fail' cells as shown in FIG. 12.

The fail manage circuit 225 receives the access address ADDR, and determines that two 'fail' cells exist in a memory region designated by the access address ADDR by referring to the fail address memory 480. When one codeword designated by the access address ADDR has two-bit error, the fail manage circuit 225 generates the first control signal CTL1 for replacing local data lines LIO, which are accessed by the fail cell address, with local data lines RLIO of the second memory block 314. The first control signal CTRL1 is provided to the switching circuits 291~294.

During a write operation, the semiconductor memory device 201a delivers data to be delivered to the memory block MB0 to the second data lines EDBIO[0:7]. Data to be delivered to the memory blocks MB1~MB15 are stored in memory cells of the memory blocks MB1~MB15 through the switching circuits 292 and 293. Data delivered to the second data lines EDBIO[0:7] is stored in the memory cells of the second memory block 314 through the switching circuit 294.

During a read operation, the semiconductor memory device 201a delivers data read from the memory blocks MB1~MB15 to the data lines GIO[8:127] via the switching circuits 292 and 293, and delivers data read from the second memory block 314 to the second data lines EDBIO[0:7] via the switching circuit 294.

Figure 15:
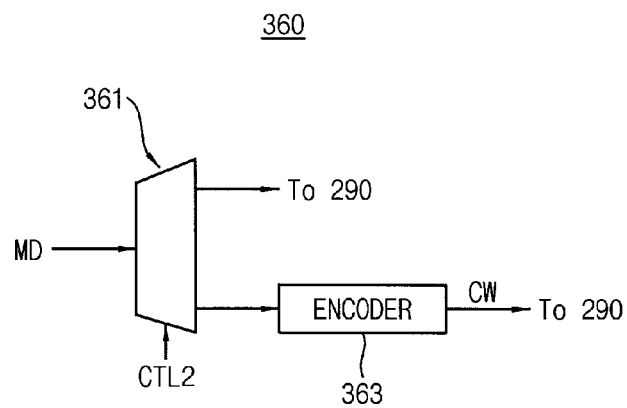
FIG. 15 illustrates the ECC circuit shown in the semiconductor memory device of FIG. 13 and FIG. 14, according to example embodiments.
Figure 15:
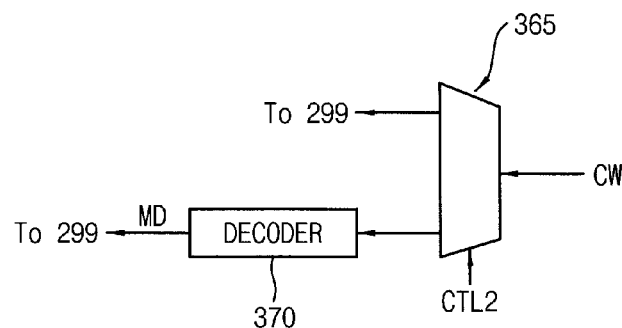

FIG. 15 illustrates the ECC circuit shown in the semiconductor memory device of FIG. 13 or FIG. 14, according to example embodiments.

Referring to FIG. 15, the ECC circuit 360 includes a demultiplexer 361, an encoder 363, a demultiplexer 365 and a decoder 370.

The demultiplexer 361, in the write operation, provides the main data MD from the data I/O buffer 299 to one of the encoder 363 and the I/O gating circuit 290 in response to the second control signal CTL2. The encoder 363 encodes the main data MD to generate the parity data and provides the I/O gating circuit 290 with the codeword CW including the main data MD and the parity data. The demultiplexer 361 provides the main data MD to the encoder 363 when the second control signal CTL2 indicates a single-bit error and provides the main data MD to the I/O gating circuit 290 when the second control signal CTL2 indicates a multi-bit error.

The demultiplexer 365, in the read operation, provides the read codeword CW to one of the decoder 370 and the data I/O buffer 299 in response to the second control signal CTL2. The demultiplexer 365 provides the read codeword CW to the decoder 370 when the second control signal CTL2 indicates a single-bit error and provides the read codeword CW to the data I/O buffer 299 when the second control signal CTL2 indicates a multi-bit error. The decoder 370 may correct a single-bit error in the main data MD using the parity data.

Figure 16:
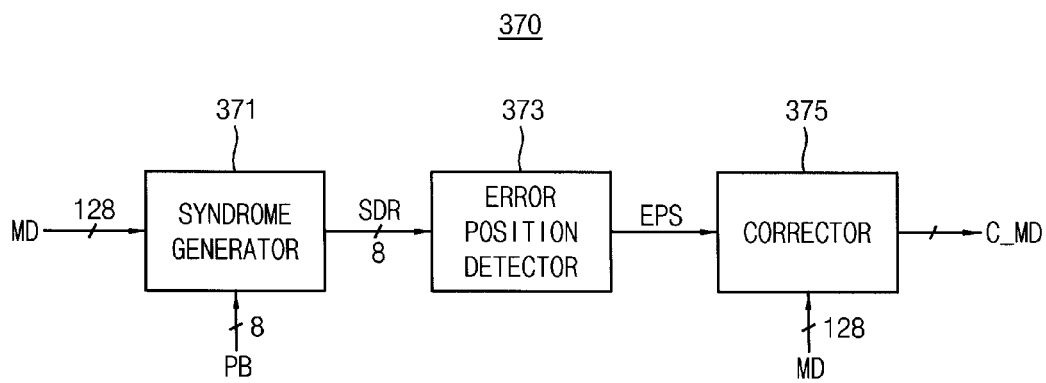
FIG. 16 is a block diagram illustrating the decoder shown in the ECC circuit of FIG. 15, according to example embodiments.

FIG. 16 is a block diagram illustrating the decoder shown in the ECC circuit of FIG. 15, according to example embodiments.

Referring to FIG. 16, the decoder 370 includes a syndrome generator 371, an error position detector 373 and an error corrector 375.

The syndrome generator 371 may generate syndromes SDR based on the main data MD and the parity data PB in the read codeword CW. The error position detector 373 may detect a position of errors in the main data MD based on the syndromes SDR to generate an error position signal EPS. For example, the error position detector 373 may calculate coefficients of error position polynomial using two or more syndromes SDR and may detect the error position to generate the error position signal EPS based on the coefficients. The error corrector 375 may correct errors in the main data MD based on the error position signal EPS to provide the corrected main data C_MD.

Figure 17A:
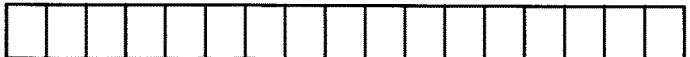
FIGS. 17A through 17C respectively illustrate the fail address memory shown in the semiconductor memory device of FIG. 3A, according to example embodiments.
Figure 17B:
Figure 17C:

FIGS. 17A through 17C respectively illustrate the fail address memory shown in the semiconductor memory device of FIG. 3A, according to example embodiments.

In FIGS. 17A through 17C, the first result signal CRS1 is stored in the first region 481a and the second result signal CRS2 is stored in the second region 483a.

Referring to FIG. 17A, when the first result signal CRS1 stored in the first region 481a includes no bit having a logic high level, and the second result signal CRS2 stored in the second region 483a includes no bit having a logic high level, a corresponding codeword has no errors (NE).

Referring to FIG. 17B, when the first result signal CRS1 stored in the first region 481a includes one bit having a logic high level, and the second result signal CRS2 stored in the second region 483a includes one bit having a logic high level, and thus, a number of bits having a logic high level in the first region 481a and the second region 483a is two, a corresponding codeword has a single-bit error (CE) that is correctable by the ECC circuit 360.

Referring to FIG. 17C, when the first result signal CRS1 stored in the first region 481a includes two bits having a logic high level, and the second result signal CRS2 stored in the second region 483a includes two bits having a logic high level, and thus, a number of error bits having a logic high level in the first region 481a and the second region 483a is equal to or greater than three, a corresponding codeword has a multi-bit error (UE) that is not correctable by the ECC circuit 360. The multi-bit error may be repaired by a redundancy repair operation.

Figure 18:
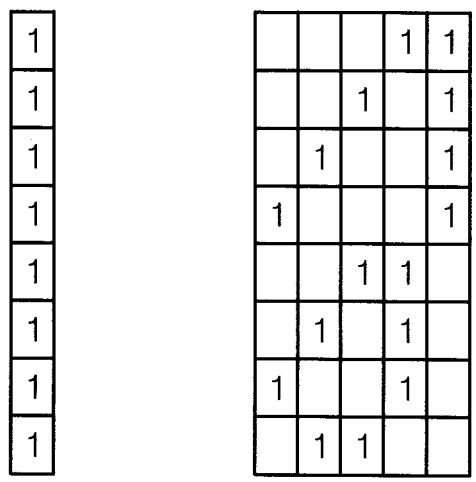
FIG. 18 illustrates that each bit in the second region in which the second result signal is stored is coded, according to example embodiments.

FIG. 18 illustrates that each bit in the second region in which the second result signal is stored is coded, according to example embodiments.

Referring to FIG. 18, each bit in the second region 483a may be discriminated by selecting two bits of five bits. Therefore, each of eight bits in the second region 483a in which the second result signal CRS2 is stored may be coded into five bits as in a second region 483b.

Figure 19A:
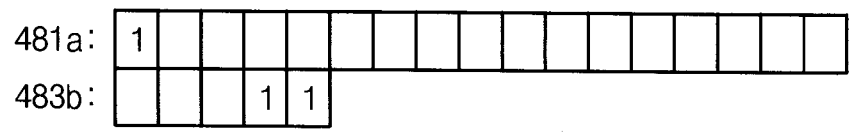
FIGS. 19A and 19B respectively illustrate the fail address memory shown in the semiconductor memory device of FIG. 3A, according to example embodiments.
Figure 19B:

FIGS. 19A and 19B respectively illustrate the fail address memory shown in the semiconductor memory device of FIG. 3A, according to example embodiments.

In FIGS. 19A and 19B, the first result signal CRS1 is stored in the first region 481a and the second result signal CRS2 is stored in the second region 483b.

Referring to FIG. 19A, when the first result signal CRS1 stored in the first region 481a includes one bit having a logic high level, and the second result signal CRS2 stored in the second region 483b includes two bits having a logic high level, and thus, a number of bits having a logic high level in the first region 481a and the second region 483b is three, a corresponding codeword has a single-bit error (CE) that is correctable by the ECC circuit 360.

Referring to FIG. 19B, when the first result signal CRS1 stored in the first region 481a includes two bits having a logic high level, and the second result signal CRS2 stored in the second region 483a includes two bits having a logic high level, and thus, a number of error bits having a logic high level in the first region 481a and the second region 483b is equal to or greater than four, a corresponding codeword has a multi-bit error (UE) that is not correctable by the ECC circuit 360. The multi-bit error may be repaired by a redundancy repair operation.

Figure 20:
FIG. 20 illustrates that each bit in the first region in which the second result signal is stored is coded, according to example embodiments.

FIG. 20 illustrates that each bit in the first region in which the second result signal is stored is coded, according to example embodiments.

Referring to FIG. 20, each bit in the first region 481a may be discriminated by selecting three bits of six bits. Therefore, each of thirteen bits in the first region 481a in which the second result signal CRS2 is stored may be coded into six bits as in a first region 481c.

Figure 21A:
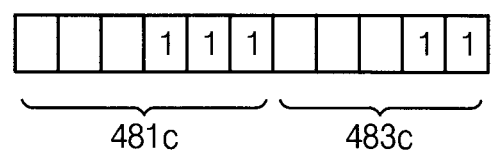
FIGS. 21A and 21B respectively illustrate the fail address memory shown in the semiconductor memory device of FIG. 3A, according to example embodiments.
Figure 21B:
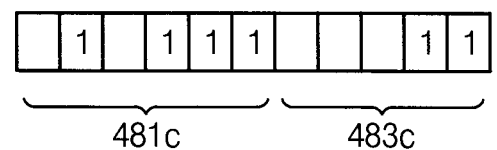

FIGS. 21A and 21B respectively illustrate the fail address memory shown in the semiconductor memory device of FIG. 3A, according to example embodiments.

In FIGS. 21A and 21B, the first result signal CRS1 is stored in the first region 481c and the second result signal CRS2 is stored in a second region 483c.

Referring to FIG. 21A, when the first result signal CRS1 stored in the first region 481c includes three bits having a logic high level, and the second result signal CRS2 stored in the second region 483c includes two bits having a logic high level, and thus, a number of error bits having a logic high level in the first region 481c and the second region 483c is five, a corresponding codeword has a single-bit error (CE) that is correctable by the ECC circuit 360.

Referring to FIG. 21B, when the first result signal CRS1 stored in the first region 481c includes four bits having a logic high level, and the second result signal CRS2 stored in the second region 483c includes two bits having a logic high level, and thus, a number of error bits having a logic high level in the first region 481c and the second region 483c is equal to or greater than six, a corresponding codeword has a multi-bit error (UE) that is not correctable by the ECC circuit 360. The multi-bit error may be repaired by a redundancy repair operation.

In FIGS. 21A and 21B, a fail address on one codeword includes 11 bits. In some embodiments, a fail address on one codeword may include 12 bits by storing a seventeenth bit of the first result signal CRS1 in a separate region instead of the first region 481a.

Figure 22A:
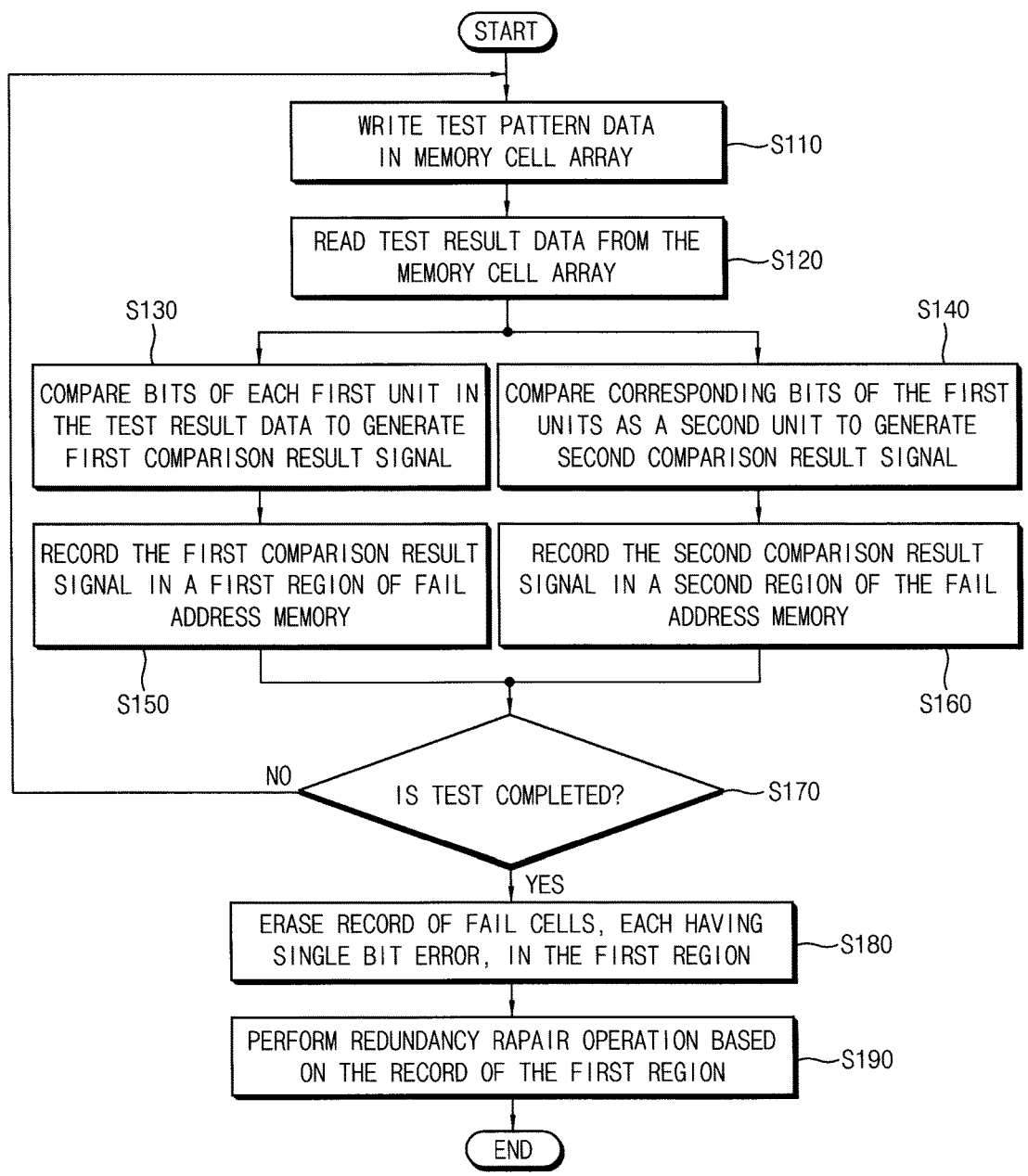
FIG. 22A is a flow chart illustrating a method of operating a semiconductor memory device according to example embodiments.
Figure 22B:
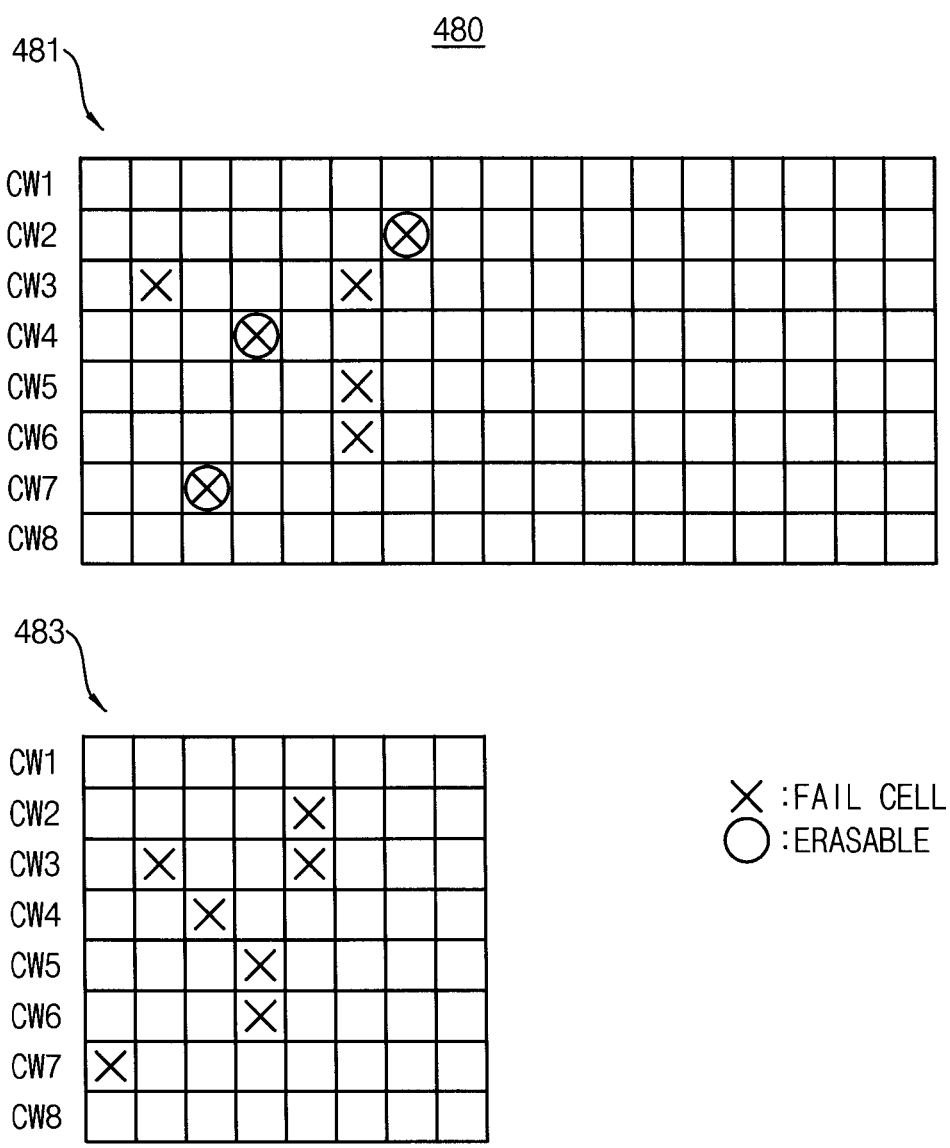
FIG. 22B illustrates the fail address memory, according to example embodiments.

FIG. 22A is a flow chart illustrating a method of operating a semiconductor memory device according to example embodiments and FIG. 22B illustrates the fail address memory.

Referring to FIG. 3A or 3B, 8 through 16, 22A and 22B, the test circuit 400 writes the test pattern data TP in the first memory blocks 311~313 and the second memory block 314 on codeword basis for one test item (S110). The test circuit 400 reads the test result data TRS from the first memory blocks 311~313 and the second memory block 314 (S120). The first comparison circuit 410 compares each first unit in the test result data TRS to generate the first result signal CRS1 (S130). The second comparison circuit 440 compares corresponding bits in the first units as each second unit to generate the second result signal CRS2 (S140). The test circuit 400 stores the first result signal CRS1 in the first region 481 of the fail address memory 480 on codeword basis (S150). The test circuit 400 stores the second result signal CRS2 in the second region 483 of the fail address memory 480 on codeword basis (S160). The test circuit 400 determines whether the test is performed for all test items (S170). When test is not completed (NO in S170), the steps (S110~S160) are repeated. When test is completed (YES in S170), the fail manage circuit 225 erases correctable errors, which is correctable by the ECC circuit 360, of first error bits stored in the first region 481 to generate second error bits (S180). The fail manage circuit 225 repairs the 'fail cells' by redundancy repair operation based on the second error bits in the first region 481.

Figure 23:
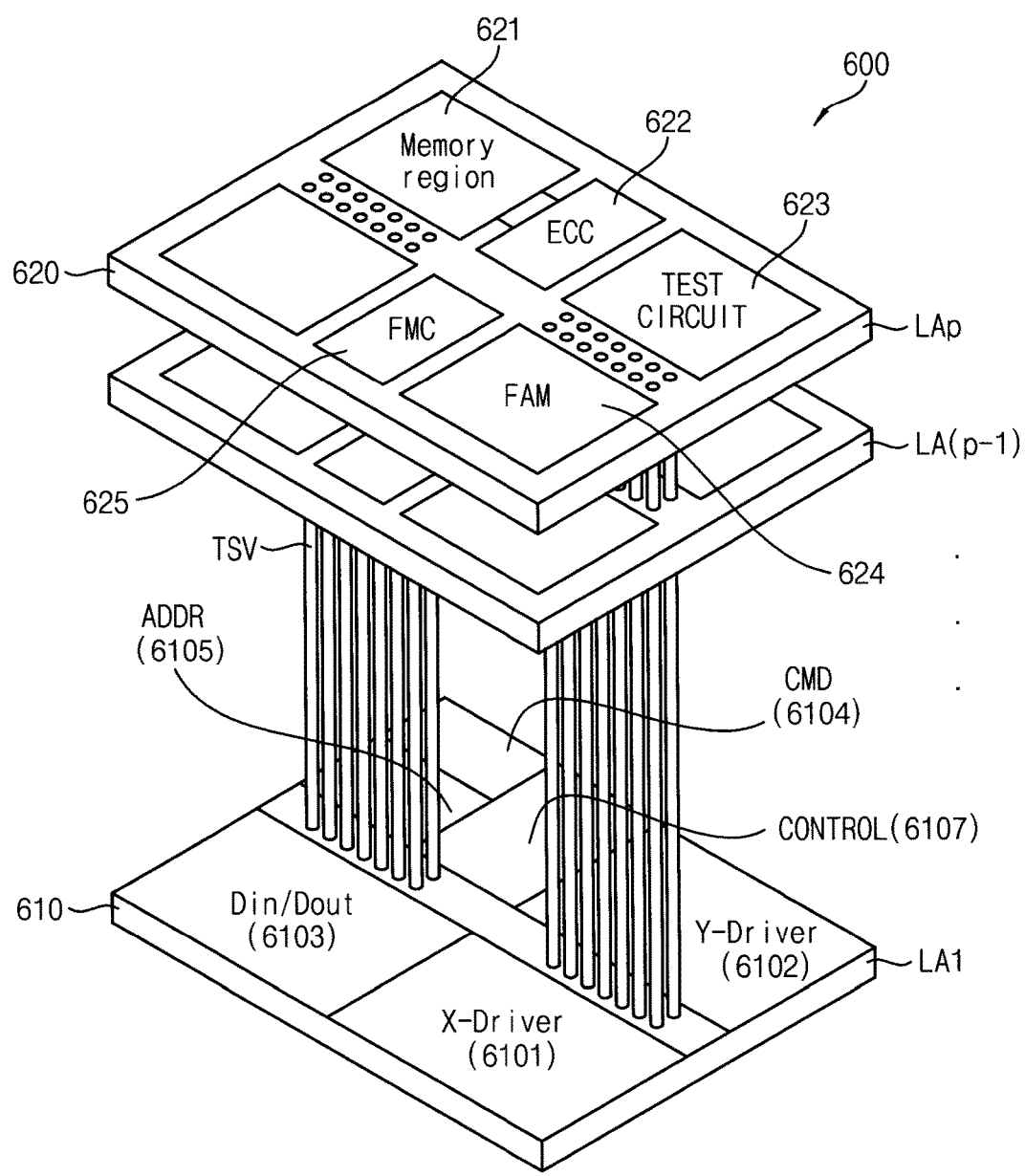
FIG. 23 is a structural diagram illustrating a semiconductor memory device according to example embodiments.

FIG. 23 is a structural diagram illustrating a semiconductor memory device according to example embodiments.

Referring to FIG. 23, a semiconductor memory device 600 may include first through pth semiconductor integrated circuit layers LA1 through LAp, in which the lowest first semiconductor integrated circuit layer LA1 is assumed to be an interface or control chip and the other semiconductor integrated circuit layers LA2 through LAp are assumed to be slave chips including core memory chips. The first through kth semiconductor integrated circuit layers LA1 through LAp may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the nth semiconductor integrated circuit layer LAp or 620 as the slave chip.

The first semiconductor integrated circuit layer 610 may include various peripheral circuits for driving memory regions 621 provided in the pth semiconductor integrated circuit layer 620. For example, the first semiconductor integrated circuit layer 610 may include a row (X)-driver 6101 for driving word-lines of a memory, a column (Y)-driver 6102 for driving bit-lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address. The memory region 621 may include a plurality of bank arrays in which a plurality of memory cells are arranged, and each of the plurality of bank arrays may include first memory blocks and a second memory block as described with reference to FIG. 8.

The first semiconductor integrated circuit layer 610 may further include a control logic 6107. The control logic 6107 may access the memory region 621 and may generate control signals for accessing the memory region 621 based on the command from the memory controller.

The pth semiconductor integrated circuit layer 620 may include an ECC circuit 622 that corrects errors in the memory cells in the memory region 621, a test circuit 623 that determines a number of 'fail' cells in the memory region 621 on codeword basis in a test mode, a fail address memory 624 and a fail manage circuit 625. As described with reference to FIGS. 8 through 22B, the test circuit 623 may read the test pattern data from the memory blocks in the memory region 621 on codeword basis in a test mode, on comparing bits of each first unit in the test pattern data to output a first result signal, may compare corresponding bits in the first units as each second unit and to output a second result signal, and may store the first result signal and the second result signal in the fail address memory 624. The fail manage circuit 625 may repair 'fail' cells by one of an ECC operation and a redundancy repair operation based on a number of the 'fail' cells, included in an access address, by referring to the fail address memory 624.

Figure 24:
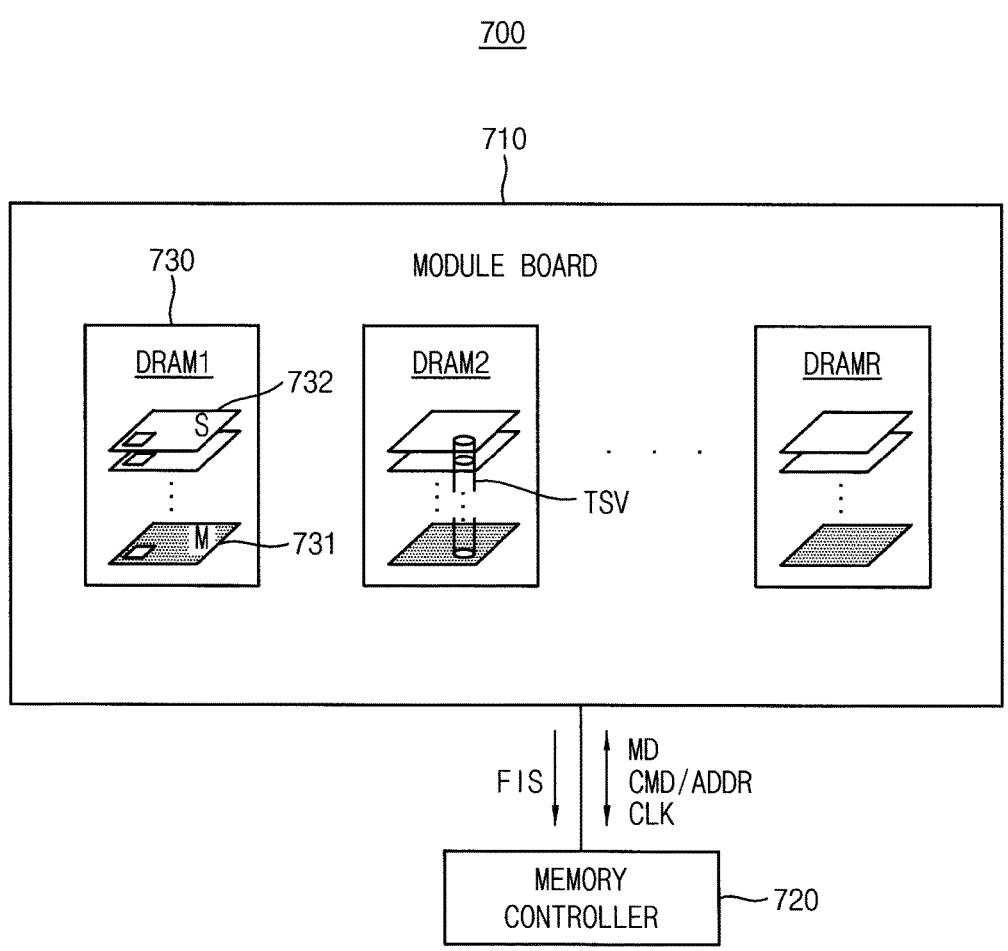
FIG. 24 illustrates a memory system including the semiconductor memory device according to example embodiments.

FIG. 24 illustrates a memory system including the semiconductor memory device according to example embodiments.

Referring to FIG. 24, a memory system 700 may include a memory module 710 and a memory controller 720. The memory module 710 may include at least one semiconductor memory device 730 mounted on a module board. The semiconductor memory device 730 may employ the semiconductor memory device 201a of FIG. 3A. For example, the semiconductor memory device 730 may be constructed as a DRAM chip or a MRAM chip. In addition, the semiconductor memory device 730 may include a stack of semiconductor chips. In this case, the semiconductor chips may include at least one master chip 731 and at least one slave chip 732. Signal transfer between the semiconductor chips may occur via through-silicon vias TSV.

The master chip 731 and the slave chip 732 may employ the semiconductor memory device 201a of FIG. 3A. Therefore, each of the master chip 731 and the slave chip 732 may include an ECC circuit that corrects errors in the memory cells, a test circuit that determines a number of 'fail' cells in the memory region on codeword basis in a test mode, a fail address memory and a fail manage circuit. As described with reference to FIGS. 8 through 22B, the test circuit may read the test pattern data from the memory blocks in the memory region on codeword basis in a test mode, on comparing bits of each first unit in the test pattern data to output a first result signal, may compare corresponding bits in the first units as each second unit and to output a second result signal, and may store the first result signal and the second result signal in the fail address memory. The fail manage circuit may repair 'fail' cells by one of an ECC operation and a redundancy repair operation based on a number of the 'fail' cells, included in an access address, by referring to the fail address memory. For example, the test circuit or the fail manage circuit may provide the memory controller 720 with fail information signal FIS including pass/fail information on data stream (test pattern data) and addition information on the data stream.

The memory module 710 may communicate with the memory controller 720 via a system bus. Main data MD, a command/address CMD/ADDR, and a clock signal CLK may be transmitted and received between the memory module 710 and the memory controller 720 via the system bus.

In addition, in certain embodiments of the present inventive concept, a three dimensional (3D) memory array is provided in semiconductor memory device 730. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648, which are hereby incorporated by reference in their entirety.

Figure 25:
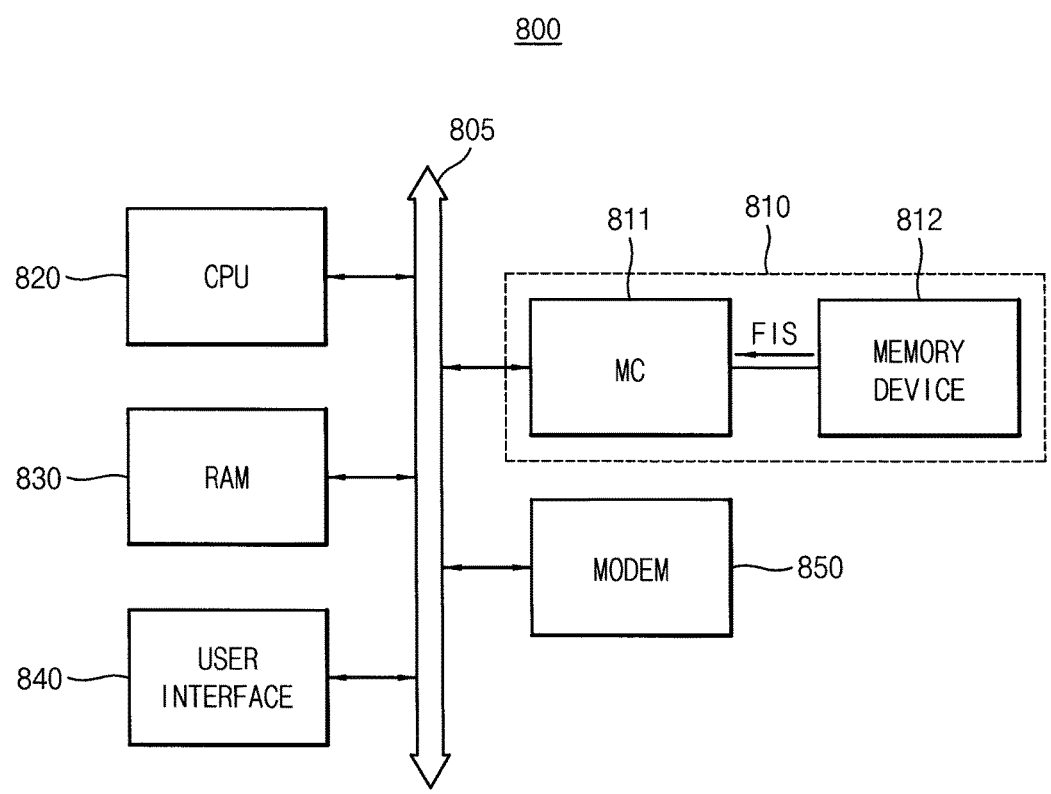
FIG. 25 is a block diagram illustrating a computing system including the semiconductor memory device according to example embodiments.

FIG. 25 is a block diagram illustrating a computing system including the semiconductor memory device according to example embodiments.

Referring to FIG. 25, a computing system 800 may be mounted on a mobile device or a desktop computer. The computing system 800 may include a memory system 810, a central processing unit (CPU) 820, a RAM 830, a user interface 840, and a modem 850 such as a baseband chipset, which are electrically connected to a system bus 805. The computing system 800 may further include an application chipset, a camera image processor (CIS), and an input/output device.

The user interface 840 may be an interface for transmitting data to a communication network or receiving data from the communication network. The user interface 840 may have a wired or wireless form, and may include an antenna or a wired/wireless transceiver. Data applied through the user interface 840 or the modem 850 or processed by the CPU 820 may be stored in the memory system 810.

The memory system 810 includes a semiconductor memory device 812 such as DRAM and a memory controller 811. Data processed by the CPU 820 or external data is stored in the semiconductor memory device 812. The semiconductor memory device 812 may include an ECC circuit that corrects errors in the memory cells, a test circuit that determines a number of 'fail' cells in the memory region on codeword basis in a test mode, a fail address memory and a fail manage circuit. As described with reference to FIGS. 8 through 22B, the test circuit may read the test pattern data from the memory blocks in the memory region on codeword basis in a test mode, on comparing bits of each first unit in the test pattern data to output a first result signal, may compare corresponding bits in the first units as each second unit and to output a second result signal, and may store the first result signal and the second result signal in the fail address memory. The fail manage circuit may repair 'fail' cells by one of an ECC operation and a redundancy repair operation based on a number of the 'fail' cells, included in an access address, by referring to the fail address memory. That is, the test circuit or the fail manage circuit may provide the memory controller 811 with fail information signal FIS including pass/fail information on data stream (test pattern data) and addition information on the data stream.

When the computing system 800 is a device that performs wireless communications, the computing system 800 may be used in a communication system such as code division multiple access (CDMA), global system for mobile communication (GSM), North American multiple access (NADC), or CDMA2000. The computing system 800 may be mounted on an information processing device such as a personal digital assistant (PDA), a portable computer, a web tablet, a digital camera, a portable media player (PMP), a mobile phone, a wireless phone, or a laptop computer.

Although a system includes a separate storage unit for storing a large amount of data such as a cache memory or a RAM having a high processing speed, these memories may be replaced by one memory system of the present inventive concept. Accordingly, since a large amount of data may be rapidly stored in a memory device, a computing system may have a simple structure.

Figure 26:
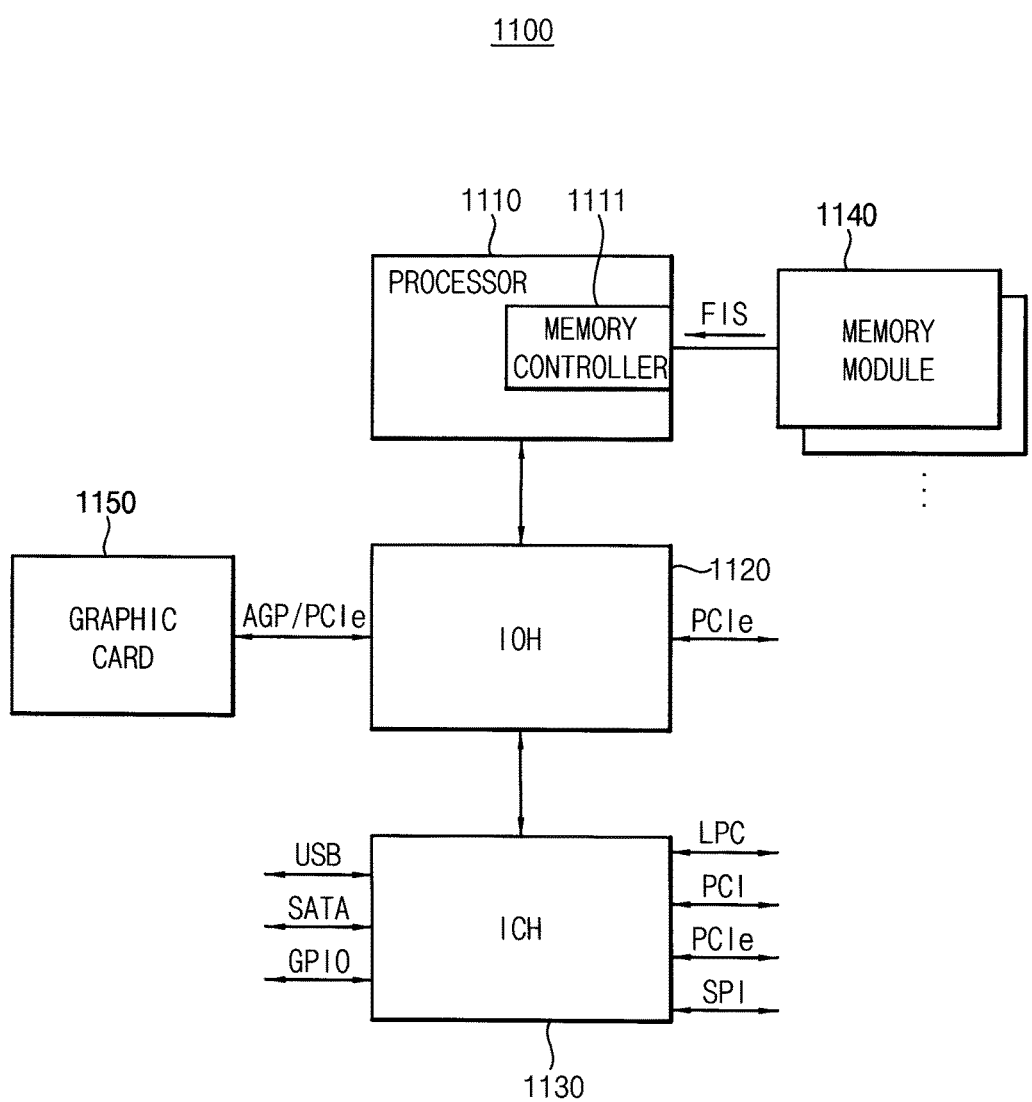
FIG. 26 is a block diagram illustrating a computing system including the semiconductor memory device according to example embodiments.

FIG. 26 is a block diagram illustrating a computing system including the semiconductor memory device according to example embodiments.

Referring to FIG. 26, a computing system 1100 may include a processor 1110, an input/output hub (IOH) 1120, an input/output controller hub (ICH) 1130, at least one memory module 1140 and a graphics card 1150. In some embodiments, the computing system 1100 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 21 illustrates the computing system 1100 including one processor 1110, in some embodiments, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In some embodiments, the memory controller 1111 may be located inside the input/output hub 1120, which may be referred to as a memory controller hub (MCH).

The memory module 1140 may include a plurality of semiconductor memory devices that store data provided from the memory controller 1111. Each of the plurality of semiconductor memory devices may include an ECC circuit that corrects errors in the memory cells, a test circuit that determines a number of 'fail' cells in the memory region on codeword basis in a test mode, a fail address memory and a fail manage circuit. As described with reference to FIGS. 8 through 22B, the test circuit may read the test pattern data from the memory blocks in the memory region on codeword basis in a test mode, on comparing bits of each first unit in the test pattern data to output a first result signal, may compare corresponding bits in the first units as each second unit and to output a second result signal, and may store the first result signal and the second result signal in the fail address memory. The fail manage circuit may repair 'fail' cells by one of an ECC operation and a redundancy repair operation based on a number of the 'fail' cells, included in an access address, by referring to the fail address memory. For example, the test circuit or the fail manage circuit may provide the memory controller 1111 with fail information signal FIS including pass/fail information on data stream (test pattern data) and addition information on the data stream.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a Quick-Path interconnect (QPI), a common system interface (CSI), etc. Although FIG. 21 illustrates the computing system 1100 including one input/output hub 1120, in some embodiments, the computing system 1100 may include a plurality of input/output hubs. The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal semiconductor memory device. In some embodiments, the input/output hub 1120 may include an internal graphics device along with or instead of the graphics card 1150 outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration in order to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

Aspects of the present inventive concept may be applied to systems using semiconductor memory devices. For example aspects of the present inventive concept may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, or other such electronic devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept.

What is claimed is:

1. A semiconductor memory device comprising:
   a memory cell array including a plurality of memory blocks, each memory block including a plurality of memory cells connected to intersections of word-lines and bit-lines;
   an input/output (I/O) gating circuit connected between the memory cell array and data lines; and
   a test circuit connected to the I/O gating circuit through the data lines, and configured to:
   read out a data stream from the memory cell array, wherein the data stream includes a plurality of first bits output from the plurality of memory blocks and received from the data lines, first units of bits of the plurality of first bits each first unit comprising bits output only from a corresponding memory block, and second units of bits of the plurality of first bits each second unit comprising a corresponding bit of each of the first units of bits, each second unit of bits being received from a different memory block of the plurality of memory blocks;
   perform a plurality of first comparisons, each first comparison comprising a comparison of all bits of a corresponding first unit in the data stream;
   store a first result signal as a result of the plurality of the first comparisons;
   perform a plurality of second comparisons, each second comparison comprising a comparison of all bits of a corresponding second unit, the all bits of a corresponding second unit being received from a different memory block of the plurality of memory blocks;
   store a second result signal as a result of the plurality of the second comparisons; and
   output a fail information signal including pass/fail information on the data stream and additional information on the data stream to outside the semiconductor memory device based on the first result signal and the second result signal during a test mode of the semiconductor memory device.

2. The semiconductor memory device of claim 1, wherein the data stream is test pattern data written in the memory cell array,
   wherein the fail information signal includes the first result signal representing a comparison result of bits of each first unit in the test pattern data and the second result signal representing a comparison result of bits of each second unit in the test pattern data,
   wherein the additional information indicates whether a number of fail cells in a memory region of the memory cell array, corresponding to the data stream, is a single-bit error or a multi-bit error and positions of fail cells, and
   wherein the bits of the each first unit corresponds to data of a burst length of the semiconductor memory device.

3. The semiconductor memory device of claim 2, wherein the test circuit comprises:
a first comparison circuit configured to compare the bits of each first unit in the test pattern data to output the first result signal; and
a second comparison circuit configured to compare the bits of each second unit in the test pattern data to output the second result signal.

4. The semiconductor memory device of claim 3, wherein the first comparison circuit outputs a first comparison signal indicating whether the bits of each first unit in the test pattern data are same with respect to each other and the second comparison circuit outputs a second comparison signal indicating whether the bits of each second unit in the test pattern data are same with respect to each other.

5. The semiconductor memory device of claim 2, wherein the test circuit writes the test pattern data in the memory cell array on codeword basis,
wherein the plurality of memory blocks includes a plurality of first memory blocks and a second memory block, and
wherein the semiconductor memory device further comprises:
a fail address memory configured to store the first result signal and the second result signal;
a fail manage circuit configured to repair fail cells by one of an error correction code (ECC) operation and a redundancy repair operation based on the number of the fail cells, included in an access address, by referring to the fail address memory, in a normal mode of the semiconductor memory device;
an ECC circuit configured to perform the ECC operation under control of the fail manage circuit; and
a plurality of switching circuit coupled to a plurality of first memory cells in the plurality of first memory blocks through first bit-lines and coupled to a plurality of second memory cells in the second memory block through second bit-lines.

6. The semiconductor memory device of claim 5, wherein the fail manage circuit is configured to repair the fail cells by the redundancy repair operation when the number of the fail cells is equal to or greater than two, and
wherein the fail manage circuit is configured to control the plurality of switching circuits such that a first block of the first memory blocks is replaced by a second block of the second memory block when the fail manage circuit performs the redundancy repair operation.

7. The semiconductor memory device of claim 5, wherein the fail manage circuit is configured to repair the fail cells by the ECC operation when the number of the fail cells is equal to one, and
wherein the fail manage circuit is configured to control the plurality of switching circuits such that parity bits repairing the fail cells of the first memory cells is stored in the second memory cells.

8. The semiconductor memory device of claim 5, wherein the fail address memory includes a first region and a second region that store the first result signal and the second result signal, respectively, on the codeword basis,
wherein the first result signal includes a plurality of third bits, each corresponding to the each first unit, and
wherein the second result signal includes a plurality of fourth bits, each corresponding to the each second unit.

9. The semiconductor memory device of claim 8, wherein the fail manage circuit is configured to repair the fail cells by one of the ECC operation and the redundancy repair operation based on a number of error bits of the plurality of third bits and the fourth bits, each error bit having a first logic level, and
the fail manage circuit is configured to generate second error bits by erasing some of first error bits of the first result signals stored in the first region, and is configured to perform the redundancy repair operation based on the second error bits stored in the first region, each erased first error bit repairable by the ECC circuit.

10. The semiconductor memory device of claim 5, wherein the fail address memory includes a first region and a second region that store the first result signal and the second result signal, respectively, on the codeword basis,
wherein the first result signal includes one of a plurality of third bits, each corresponding to the each first unit and a plurality of fifth bits into which the plurality of third bits are coded, and
wherein the second result signal includes one of a plurality of fourth bits, each corresponding to the each second unit and a plurality of sixth bits into which the plurality of fourth bits are coded.

11. The semiconductor memory device of claim 5, wherein the test circuit is configured to write the test pattern data, configured to read the test pattern data and configured to output the first result signal and the second result signal for each test item in the test mode, and
wherein the fail address memory is configured to stores the first result signal and the second result signal by accumulating the first result signal and the second result signal for each test item.

12. The semiconductor memory device of claim 1, wherein the test circuit is configured to provides the fail information signal to an external test device,
wherein the external test device is configured to determines a repair policy of fail cells based on a number of the fail cells in the fail information signal, and
wherein the memory cell array is a three dimensional memory cell array.

13. The semiconductor memory device of claim 12, further comprising:
a control logic circuit configured to compare an access address with fail addresses of the fail cells and configured to repair the fail cells by one of an error correction code (ECC) operation and a redundancy repair operation based on the number of the fail cells in the access address.

14. A memory system comprising:
a semiconductor memory device; and
a test device configured to test the semiconductor memory device,
wherein the semiconductor memory device comprises:
a memory cell array including a plurality of memory blocks, each memory block including a plurality of memory cells connected to intersections of word-lines and bit-lines; and
a test circuit configured to read a data stream from the memory cell array, the data stream including bits of a plurality of first units, the test circuit configured to compare bits of each first unit of the plurality of first units in the data stream, compare corresponding bits in the plurality of first units as each second unit, which are bits of the each second unit of the plurality of first units, and configured to output a fail information signal including pass/fail information on the data stream and additional information on the data stream, in a test mode of the semiconductor memory device, wherein each bit of the bits of the each first unit is output from the same memory block of the plurality of memory blocks, and wherein each bit of the bits of the each second unit is output from a different memory block of the plurality of memory blocks.

15. The memory system of claim 14, wherein the data stream is test pattern data written in the memory cell array, wherein the fail information signal includes a first result signal representing a comparison result of the bits of the each first unit in the test pattern data and a second result signal representing a comparison result of the bits of the each second unit in the test pattern data, and wherein the bits of the each first unit corresponds to data of a burst length of the semiconductor memory device.

16. The memory system of claim 15, wherein the test circuit writes the test pattern data in the memory cell array on codeword basis, wherein the test device is configured to provides the test pattern data to the semiconductor memory device, and wherein the test device includes a fail address memory configured to store the first result signal and the second result signal on the codeword basis.

17. The memory system of claim 15, wherein the test circuit is configured to write the test pattern data, configured to read the test pattern data and configured to output the first result signal and the second result signal to the test device for each test item in the test mode, and wherein the test device includes a fail address memory configured to stores the first result signal and the second result signal by accumulating the first result signal and the second result signal for each test item.

18. A method of operating a semiconductor memory device including a memory cell array having a plurality of memory blocks, the method comprising:

reading test pattern data from the memory cell array in a codeword basis, in a test mode of the semiconductor memory device, wherein the test pattern data includes bits of a plurality of first units;

comparing bits of each first unit of the plurality of first units in the test pattern data to output a first result signal;

comparing corresponding bits in the plurality of first units as each second unit, which are bits of the each second unit of the plurality of first units, to output a second result signal;

storing the first result signal and the second result signal in a first region and a second region of a fail address memory respectively; and repairing fail cells by one of an error correction code (ECC) operation and a redundancy repair operation based on a number of the fail cells, included in an access address, by referring to the fail address memory, in a normal mode of the semiconductor memory device, wherein each bit of the comparing bits of the each first unit is output from the same memory block of the plurality of memory blocks, and wherein each bit of the comparing bits of the each second unit is output from a different memory block of the plurality of memory blocks.

19. The method of claim 18, further comprising:

repairing the fail cells by the ECC operation when the number of the fail cells is equal to one.

20. The method of claim 18, wherein the plurality of memory blocks includes a plurality of first memory blocks and a second memory block, and wherein the bits of the each first unit corresponds to data of a burst length of each of the first memory blocks and the second memory block.

* * * * *